(12) United States Patent
Ogura et al.

(10) Patent No.: US 10,689,517 B2
(45) Date of Patent: Jun. 23, 2020

(54) COLOR MATERIAL DISPERSION LIQUID, COLOR RESIN COMPOSITION, COLOR MATERIAL, COLOR FILTER, METHOD FOR PRODUCING COLOR FILTER, LIQUID CRYSTAL DISPLAY DEVICE, AND LIGHT-EMITTING DISPLAY DEVICE

(71) Applicant: DAI NIPPON PRINTING CO., LTD., Tokyo-to (JP)

(72) Inventors: Michihiro Ogura, Tokyo-to (JP); Tomoki Murata, Tokyo-to (JP); Fumiyasu Murakami, Tokyo-to (JP); Daisuke Endo, Tokyo-to (JP); Yohei Ito, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 416 days.

(21) Appl. No.: 15/567,550

(22) PCT Filed: Apr. 20, 2016

(86) PCT No.: PCT/JP2016/062568
§ 371 (c)(1),
(2) Date: Dec. 27, 2017

(87) PCT Pub. No.: WO2016/171193
PCT Pub. Date: Oct. 27, 2016

(65) Prior Publication Data
US 2018/0100068 A1  Apr. 12, 2018

(30) Foreign Application Priority Data

Apr. 22, 2015 (JP) ................. 2015-087645

(51) Int. Cl.
*C09B 63/00* (2006.01)
*G02B 5/20* (2006.01)
(Continued)

(52) U.S. Cl.
CPC ............ *C09B 63/005* (2013.01); *C09B 63/00* (2013.01); *C09B 67/0084* (2013.01); *G02B 5/20* (2013.01);
(Continued)

(58) Field of Classification Search
CPC ... C09B 63/00; C09B 63/005; C09B 67/0084; C09B 67/006; G02F 1/133514;
(Continued)

(56) References Cited

U.S. PATENT DOCUMENTS

2014/0037866 A1  2/2014  Okada
2016/0187547 A1  6/2016  Murata et al.
2016/0282530 A1*  9/2016  Ogura ................... G02B 5/223

FOREIGN PATENT DOCUMENTS

CN  105659117  6/2016
JP  2001-081348  3/2001
(Continued)

*Primary Examiner* — Eli D. Strah
(74) *Attorney, Agent, or Firm* — Hamre, Schumann, Mueller & Larson, P.C.

(57) ABSTRACT

A color material dispersion liquid comprising: (A) a color material, (B) a dispersant and (C) a solvent, wherein the color material (A) contains a lake color material of a combination of an acid dye and a polyaluminum chloride; a basicity of the polyaluminum chloride is 70% or more; and a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) a peak corresponding to a six-coordinate aluminum therein, is from 0 to 0.50.

17 Claims, 6 Drawing Sheets

(51) Int. Cl.
*H05B 33/12* (2006.01)
*G02F 1/1335* (2006.01)
*H01L 51/50* (2006.01)
*C09B 67/46* (2006.01)
*G02F 1/13357* (2006.01)
*H01L 27/32* (2006.01)

(52) U.S. Cl.
CPC .. *G02F 1/133514* (2013.01); *G02F 1/133516* (2013.01); *G02F 1/133603* (2013.01); *H01L 51/50* (2013.01); *H05B 33/12* (2013.01); *B32B 2457/202* (2013.01); *B32B 2457/206* (2013.01); *G02F 2001/133562* (2013.01); *G02F 2001/133624* (2013.01); *H01L 27/322* (2013.01); *Y10T 428/1036* (2015.01); *Y10T 428/1041* (2015.01)

(58) Field of Classification Search
CPC ......... G02F 1/133603; G02F 1/133516; G02F 1/1335; G02F 2001/133562; G02F 2001/133624; H01L 51/50; H01L 27/322; H05B 33/12; H05B 33/14; G02B 5/20; G02B 5/223; Y10T 428/1041; Y10T 428/1036; B32B 2457/202; B32B 2457/206

See application file for complete search history.

(56) References Cited

FOREIGN PATENT DOCUMENTS

| | | | |
|---|---|---|---|
| JP | 2006-152223 | 6/2006 | |
| JP | 2006152223 A | * 6/2006 | |
| JP | 2010-026334 | 2/2010 | |
| JP | 2012-194523 | 10/2012 | |
| JP | 2015232715 | 12/2015 | |
| TW | 201441312 | 11/2014 | |
| WO | 2012/144521 | 10/2012 | |
| WO | 2015/059962 | 4/2015 | |
| WO | WO-2015059962 A1 | * 4/2015 | ............. C09B 11/08 |

* cited by examiner

"FRONT" VIEW     "BACK" VIEW

Keggin Structure
$[Al_{13}O_4(OH)_{24}(H_2O)_{12}]^{7+}$

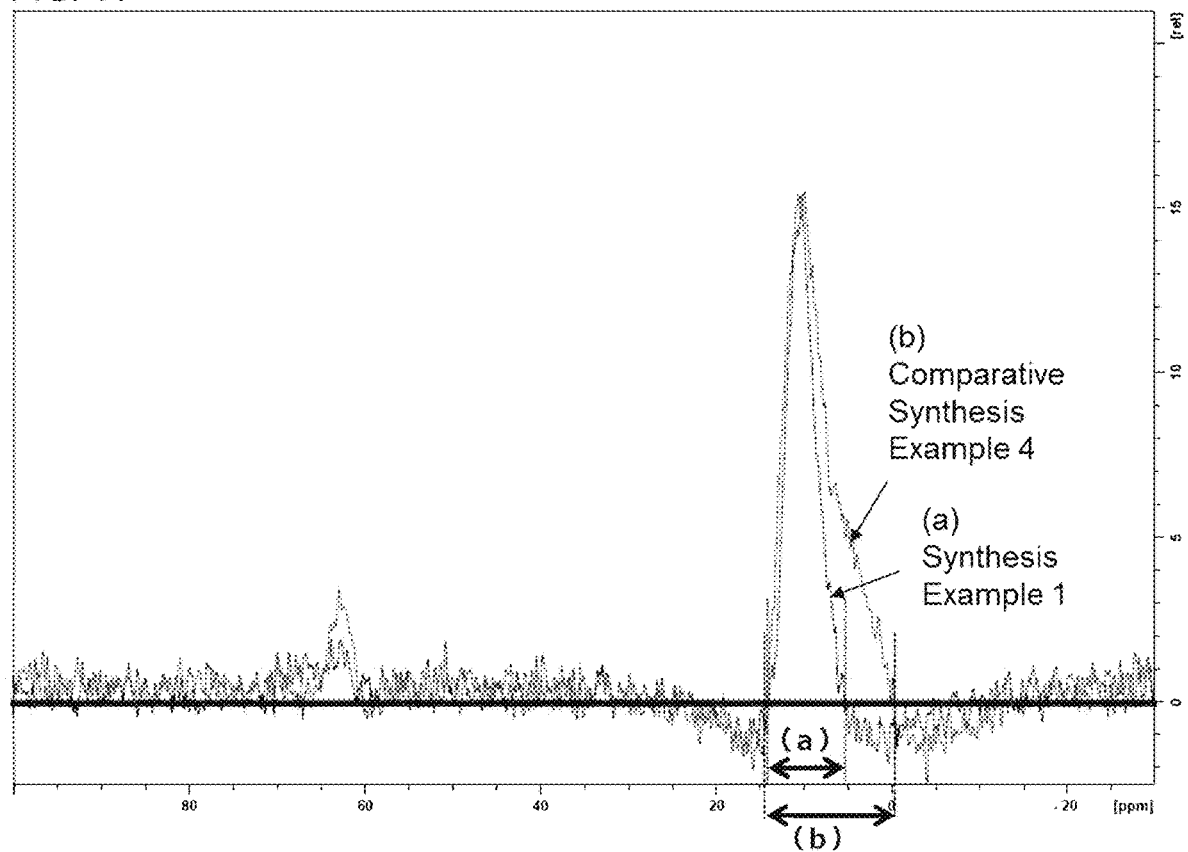

COLOR MATERIAL DISPERSION LIQUID, COLOR RESIN COMPOSITION, COLOR MATERIAL, COLOR FILTER, METHOD FOR PRODUCING COLOR FILTER, LIQUID CRYSTAL DISPLAY DEVICE, AND LIGHT-EMITTING DISPLAY DEVICE

TECHNICAL FIELD

The disclosure relates to a color material dispersion liquid, a color resin composition, a color material, a color filter, a method for producing the color filter, a liquid crystal display device, and a light-emitting display device.

BACKGROUND ART

Many thin image display devices as typified by displays, i.e., flat panel displays, have been released on the market, because they are thinner than cathode-ray tube displays and they do not occupy much space in depth. Their market price has decreased year by year with advances in production techniques, resulting in a further increase in demand and a yearly increase in production. Especially, color LCD TVs have almost become the mainstream of TVs. Also in recent years, light-emitting display devices including organic light-emitting display devices such as organic EL displays, which provide high visibility by light emitted by themselves, have received attention as the next generation of image display devices. In relation to the performance of these image display devices, there is a strong demand for a further increase in image quality, such as an increase in contrast and color reproducibility, and a decrease in power consumption.

A color filter is used in these liquid crystal display devices and light-emitting display devices. For example, in the case of color LCDs, the amount of light is controlled by using a backlight as the light source and electrically driving the liquid crystal. The light passes through the color filter and represents colors. Accordingly, the color filter is indispensable for color representation in LCD TVs and plays a large role in determining display performance. In organic light-emitting display devices, a color image is formed in the same manner as liquid crystal display devices, when the color filter is used in combination with an organic, white light-emitting element.

A recent trend is that there is a demand for power-saving image display devices. To increase backlight use efficiency, there is a very high demand for high-luminance color filters. This is a major issue especially for mobile displays such as mobile phones, smart phones and tablet PCs.

Even though technological advances have increased battery capacity, there is still a limit on battery capacity of mobile devices. Meanwhile, there is a trend that power consumption has grown with the increase in screen size. Image display devices including a color filter determine the design and performance of mobile terminal devices, because they are directly linked to the usable time and charging frequency of mobile terminal devices.

In general, a color filter includes a transparent substrate, color layers made of color patterns of the three primary colors (red, green and blue), and a light shielding part formed on the transparent substrate so as to define each color pattern.

To form such color layers, a pigment dispersion method in which pigments with excellent heat resistance and light resistance are used as color materials, has been widely used. However, it is difficult for color filters produced by use of pigments to satisfy the latest demand for higher luminance.

As a means to achieve higher luminance, dye-containing color resin compositions for a color filter have been studied. In general, dyes have a higher transmittance and can produce a higher-luminance color filter than pigments. However, dyes have a problem in that they are inferior in heat resistance and light resistance to pigments and the chromaticity is likely to change when they are heated at high temperature in a color filter production process, for example. Also, color resin compositions containing dyes have a problem in that cured coating films of the resin compositions are poor in solvent resistance, and the dyes transfer to adjacent pixels in other colors or to cured films that do not contain colorants (e.g., protective films). In addition, color resin compositions produced by use of dissolved dyes have many problems when they are used for color filter application. For example, aggregates are likely to precipitate on the surface of a cured coating film during a drying process, and a remarkable decrease in contrast is caused by the fluorescence of the dyes.

As a method for improving various kinds of resistance properties of dyes, a method for producing a salt-forming dye is known.

In Patent Document 1, a color photosensitive composition containing a dyed lake pigment is disclosed as a color photosensitive composition with excellent heat resistance, light resistance, color characteristics and transparency. Also, as the examples of the dyed lake pigment, publicly-known pigments with color index numbers are described.

However, in the dyed lake pigment disclosed in Patent Document 1, the ratio of the dye is small. Therefore, the dyed lake pigment is insufficient in coloring power, and a color layer using such a dyed lake pigment is insufficient in heat resistance and light resistance.

In Patent Document 2, an acidic dye aluminum lake pigment crystal is disclosed as a pigment with high coloring power and excellent light resistance, which is aimed at increasing the dye ratio in the pigment. However, due to large growth of the crystal particle diameter of the acidic dye aluminum lake pigment crystal of Patent Document 2, the pigment is poor in dispersibility, and it is difficult to obtain high contrast required of a color filter.

In Patent Document 3, a blue color composition for a color filter, the composition containing a colorant consisting of a copper phthalocyanine blue pigment and a metal lake pigment of a xanthene-based dye, is disclosed as a blue color composition for a color filter, the composition being capable of forming a color filter with high luminosity and a wide color reproduction range. In Patent Document 4, a blue color composition for a color filter, the composition containing a blue pigment and a salt-forming compound obtained by reaction of a xanthene-based acid dye and a compound containing a cationic group, is disclosed as a blue color composition for a color filter, the composition being capable of forming a color filter with high luminosity and a wide color reproduction range. However, an organic compound containing a quaternary ammonium salt group is merely disclosed as the compound containing the cationic group. The salt-forming compound obtained by use of the organic compound containing the quaternary ammonium salt group, has the following problems: a cured coating film of the composition is poor in solvent resistance; a sublimate is produced; and a decrease in contrast is caused by fluorescence.

In Patent Document 5, a color filter and so on are disclosed by the applicant of the present application, which use specific color materials containing divalent or higher anions and divalent or higher cations, in which dye skeletons are crosslinked by crosslinking groups. It is disclosed that the color materials are excellent in heat resistance since, due to containing the divalent or higher anions and the divalent or higher cations, molecular associations are formed therein, and color filters using the color materials are high in contrast and excellent in solvent resistance and electric reliability.

CITATION LIST

Patent Document 1: Japanese Patent Application Laid-Open (JP-A) No. 2001-81348
Patent Document 2: JP-A No. 2006-152223
Patent Document 3: JP-A No. 2010-26334
Patent Document 4: JP-A No. 2012-194523
Patent Document 5: International Publication No. WO2012/144521

SUMMARY

Technical Problem

To control a color filter to a desired color tone in conformity with a wide variety of backlights, using a combination of two or more kinds of color materials is needed. For example, in the case of obtaining a blue color layer, a desired color tone is generally obtained by use of a blue color material in combination with a red-tinged violet or red color material. In the case of using a conventionally-used pigment as a color material, due to low transmittance of the pigment, there is a problem of a decrease in luminance. In the case of using a dye, due to low heat resistance and light resistance of the dye, there is a problem of a decrease in luminance after the dye is subjected to a post baking step in color filter production.

Therefore, in Patent Document 3, adding a metal lake pigment (e.g., PR81) of a xanthene-based basic dye (Rhodamine 6G) to a blue pigment composed of copper phthalocyanine blue, is proposed.

However, it was found that in the case of using the metal lake pigment of the xanthene-based basic dye, there is such a problem that the xanthene dye sublimes during a post baking step in color filter production. Once a color material sublimes from a color layer of a color filter, there is such a problem that not only the color tone of the color layer changes, but also the sublimed color material attaches to different color layers and so on and changes the color tone of the different color layers, resulting in a decrease in luminance and occurrence of contamination inside a heating device. It was also found that even in the case of using the salt-forming compound disclosed in Patent Document 4, which is a compound obtained by reaction of a xanthene-based acid dye and a quaternary ammonium salt, a sublimate is produced in the post baking step.

Even in the case of using the aluminum chloride or polyaluminum chloride described in Patent Document 1 or 2 as a laking agent to produce a metal lake color material of an acid dye, poor dispersibility and poor color filter contrast may occur.

The disclosed embodiments were achieved in light of the above circumstances. An object of the disclosed embodiments is to provide the following: a color material dispersion liquid or a color material dispersion liquid for a color filter, the dispersion liquid being excellent in dispersibility and being capable of forming a high-contrast, high-luminance coating film; a color resin composition or a color resin composition for a color filter, the composition being excellent in dispersibility and being capable of forming a high-contrast, high-luminance color layer; a color material being excellent in dispersibility and being inhibited from subliming when heated at high temperature; a high-contrast, high-luminance color filter and a method for producing the color filter; a liquid crystal display device comprising the color filter; and a light-emitting display device comprising the color filter.

Solution to Problem

In a first embodiment, there is provided a color material dispersion liquid comprising: (A) a color material, (B) a dispersant and (C) a solvent, wherein the color material (A) contains a lake color material of a combination of an acid dye and a polyaluminum chloride; a basicity of the polyaluminum chloride is 70% or more; and a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50.

In another embodiment, there is provided a color material dispersion liquid comprising: (A) a color material, (B) a dispersant and (C) a solvent, wherein the color material (A) contains a lake color material of a combination of an acid dye and a polyaluminum chloride; a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50; and a peak width at a spectral intensity of 0 of the peak corresponding to the six-coordinate aluminum, is 13 ppm or less.

In another embodiment, there is provided a color resin composition comprising the color material dispersion liquid according to the disclosed embodiments and (D) a binder component.

In another embodiment, there is provided a color material wherein the color material is a lake color material of a combination of an acid dye and a polyaluminum chloride; a basicity of the polyaluminum chloride is 70% or more; and a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50.

In another embodiment, there is provided a color material wherein the color material is a lake color material of a combination of an acid dye and a polyaluminum chloride; a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50; and a peak width at a spectral intensity of 0 of the peak corresponding to the six-coordinate aluminum, is 13 ppm or less.

The color materials according to the disclosed embodiments, are each a color material being excellent in dispersibility, being excellent in heat resistance, and being inhibited from subliming when heated at high temperature. They can be suitably used for color filter application.

In the color materials according to the disclosed embodiments, the acid dye is preferably a rhodamine-based acid dye, from the viewpoints of being excellent in heat resistance, and being inhibited from subliming when heated at high temperature.

In another embodiment, there is provided a color filter comprising at least a transparent substrate and color layers disposed on the substrate, wherein at least one of the color layers contains a lake color material of a combination of an acid dye and a polyaluminum chloride; a basicity of the polyaluminum chloride is 70% or more; and a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50.

In another embodiment, there is provided a color filter comprising at least a transparent substrate and color layers disposed on the substrate, wherein at least one of the color layers contains a lake color material of a combination of an acid dye and a polyaluminum chloride; a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50; and a peak width at a spectral intensity of 0 of the peak corresponding to the six-coordinate aluminum, is 13 ppm or less.

In another embodiment, there is provided a method for producing a color filter comprising at least a transparent substrate and color layers disposed on the substrate, the method comprising a step of forming at least one of the color layers on the transparent substrate by curing the color resin composition for a color filter or the color resin composition according to the disclosed embodiments.

In another embodiment, there is provided a liquid crystal display device comprising the color filter according to the disclosed embodiments, a counter substrate, and a liquid crystal layer disposed between the color filter and the counter substrate.

In another embodiment, there is provided a light-emitting display device comprising the color filter according to the disclosed embodiments and a light-emitting body.

BRIEF DESCRIPTION OF DRAWINGS

In the accompanying drawings,

FIG. 10 shows the solid-state $^{27}$Al-NMR spectrum (a) of the color material of Synthesis Example 1 and the solid-state $^{27}$Al-NMR spectrum (b) of the color material of Comparative Synthesis Example 4 (in which the polyaluminum chloride with fair average quality was used as the laking agent).

DESCRIPTION OF EMBODIMENTS

Figure 1:
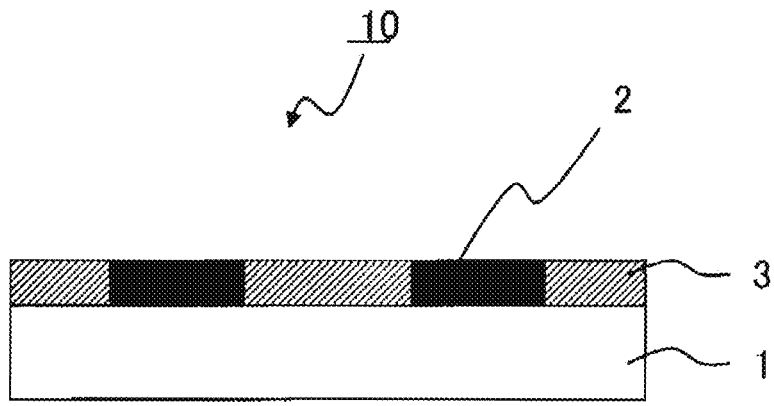
FIG. 1 is a schematic sectional view of an example of the color filter according to the disclosed embodiments.

Hereinafter, a color material dispersion liquid, a color material, a color resin composition, a color filter, a liquid crystal display device, and a light-emitting display device, all of which are according to the disclosed embodiments, will be described in order.

In the disclosed embodiments, "light" encompasses electromagnetic waves in visible and non-visible wavelength ranges and radial rays. Radial rays include microwaves and electron beams, more specifically, electromagnetic waves with a wavelength of 5 μm or less and electron beams.

Also in the disclosed embodiments, "(meth)acrylic" means any of acrylic and methacrylic, and "(meth)acrylate" means any of acrylate and methacrylate.

Also in the disclosed embodiments, "organic group" means a group containing one or more carbon atoms.

1. Color Material Dispersion Liquid

The color material dispersion liquid according to the disclosed embodiments is a color material dispersion liquid comprising: (A) a color material, (B) a dispersant and (C) a solvent, wherein the color material (A) contains a lake color material of a combination of an acid dye and a polyaluminum chloride; a basicity of the polyaluminum chloride is 70% or more; and a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50.

Also, the color material dispersion liquid according to the disclosed embodiments is a color material dispersion liquid comprising: (A) a color material, (B) a dispersant and (C) a solvent, wherein the color material (A) contains a lake color material of a combination of an acid dye and a polyaluminum chloride; a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum thereon, is from 0 to 0.50; and a peak width at a spectral intensity of 0 of the peak corresponding to the six-coordinate aluminum, is 13 ppm or less.

In the disclosed embodiments, the acid dye is laked with the polyaluminum chloride which has the specific basicity and which does not contain a specific molecular structure. Therefore, the lake color material contains the molecular structure derived from, as with the laking agent, the polyaluminum chloride which does not contain the specific molecular structure. Therefore, in both a solvent and a coating film, the lake color material is dispersed in the form of fine particles with a relatively small particle diameter. In the color material dispersion liquid according to the disclosed embodiments, the color material (A) contains the lake color material laked with the polyaluminum chloride which has the specific basicity and which does not contain the specific molecular structure; and the color material (A) is dispersed in the solvent (C). Therefore, the color material dispersion liquid becomes a color material dispersion liquid which is excellent in dispersibility can form a high-contrast, high-luminance coating film.

The mechanism that the above-described effect is exerted by the lake color material which contains the molecular structure derived from the polyaluminum chloride which does not contain the above-specified molecular structure, is not clear yet; however, it is presumed as follows.

The polyaluminum chloride used in the disclosed embodiments is represented by $Al_n(OH)_mCl_{(3n-m)}$ (where "n" is the number of aluminum atoms, and "m" is the number of hydroxy groups ($OH^-$ groups)). The basicity of the polyaluminum chloride used in the disclosed embodiments is defined by $\{(m/3n)\times100(\%)\}$. As the polyaluminum chloride used in the disclosed embodiments, one having a high basicity of 70% or more is selected. As the basicity of the polyaluminum chloride increases, that is, as the number of the hydroxy groups increases, the cationic valence of the whole polyaluminum chloride decreases. As a result, the polyaluminum chloride has an increasing number of the aluminum atoms per unit anion to enhance the property as aluminum (hydroxide) which is less soluble in water than water-soluble acid dye, and the polyaluminum chloride is likely to be insoluble. Therefore, it is presumed that the cohesion of the polyaluminum chloride as the laking agent increases. Therefore, it is presumed that even if the cationic valence of the whole polyaluminum chloride is small, the polyaluminum chloride is usable as a laking agent with high cohesion, and the lake color material thus obtained is a color material that is stronger due to hydrogen bonding of aluminum hydroxides in a cationic moiety. It is also presumed that as the cationic valence of the whole polyaluminum chloride decreases, a laking reaction with the acid dye is more likely to uniformly proceed; the particle size distribution of the lake color material is likely to be more uniform; and the color material obtains excellent dispersibility.

Figure 4:
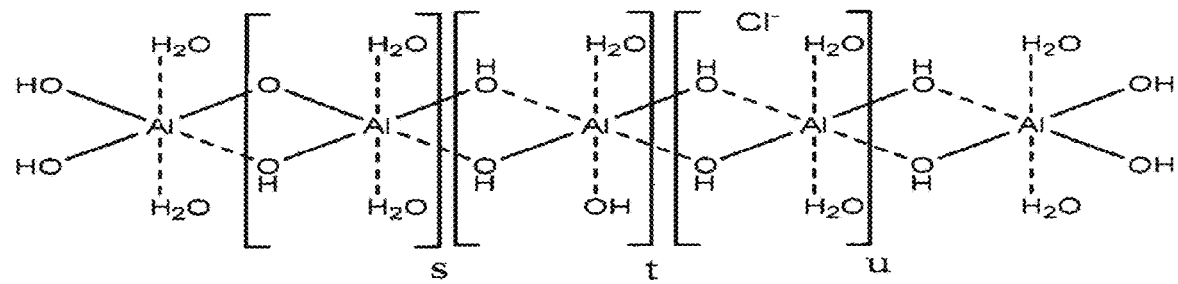
FIG. 4 is a view of an example of the structure of a polyaluminum chloride in an aqueous solution.
Figure 5:
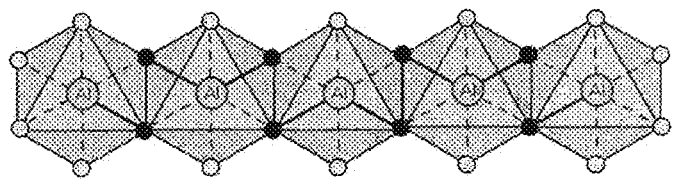
FIG. 5 is a view of an example of the structure of a polyaluminum chloride in an aqueous solution.
Figure 6:
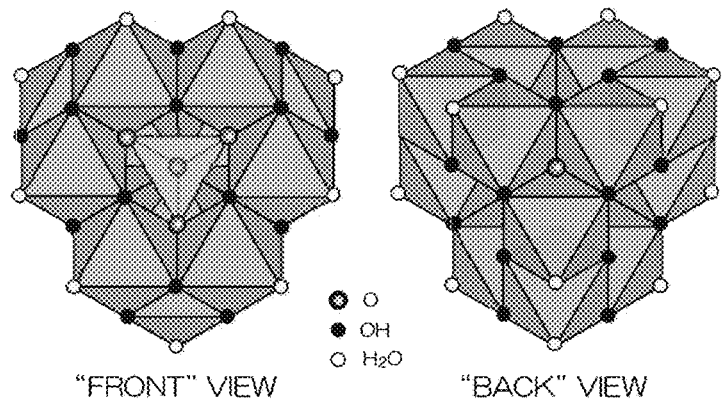
FIG. 6 is a view of another example of the structure of a polyaluminum chloride in an aqueous solution.

In addition, although the polyaluminum chloride has the same basicity as a whole, it can be present in the form of a mixture of various polymers in an aqueous solution (for example, see FIG. 4). In an aqueous solution, the polyaluminum chloride with high basicity may contain a straight chain structure as shown in FIG. 5 or a keggin structure (e.g., $[Al_{13}O_4(OH)_{24}(H_2O)_{12}]^{7+}$) as shown in FIG. 6. It was found that even if the color material is laked with the polyaluminum chloride that has the same basicity as a whole, high contrast may be obtained due to high dispersibility of the lake color material or may not be obtained. It was fond that if a certain level or more of a polymer containing the keggin structure as shown in FIG. 6 is contained in the lake color material, poor dispersibility and, as a result, low contrast are obtained. As shown in FIG. 6, in the case of the keggin structure, one aluminum atom present at the center is a four-coordinate aluminum, and 12 aluminum atoms disposed around the center are each a six-coordinate aluminum. Meanwhile, in the case of the straight chain structure, all aluminum atoms are each a six-coordinate aluminum. Therefore, by using the value of the ratio ($I_4/I_6$) between the integral value ($I_4$) of the peak corresponding to the four-coordinate aluminum in the solid-state $^{27}Al$-NMR spectrum of the lake color material and the integral value ($I_6$) of the peak corresponding to the six-coordinate aluminum therein, and making the value of the ratio ($I_4/I_6$) lower than a certain level, the keggin structure cannot be contained or, even if the keggin structure is contained, the content is small, and the keggin structure can serve as an index of the case where the dispersibility of the lake color material is not deteriorated.

The keggin structure has a very large charge (heptavalent). However, the lake color material may be precipitated from a reaction system before a salt-forming reaction corresponding to all charges occurs, and it is presumed that a reaction with the acid dye is less likely to uniformly proceed and, as a result, the particle size distribution of the lake color material is likely to be non-uniform, and the dispersibility of the lake color material decreases.

In the disclosed embodiments, the polyaluminum chloride which has high basicity and in which the keggin structure is not contained or, even if the keggin structure is contained, the content is small, is selected as the laking agent. Therefore, it is presumed that the solubility of the laked acid dye in the solvent is likely to largely decrease; the property of the laked acid dye is likely to be closer to a pigment; a laking reaction with the acid dye is likely to uniformly proceed; the particle size distribution of the lake color material is uniform; and the lake color material obtains excellent dispersibility. Also, there are such advantages that the lake color material obtains excellent heat resistance and can be easily collected (by filtration) in color material production.

In addition, it is presumed that since the cation of the polyaluminum chloride does not disturb the permeability of the acid dye, the color material obtains similar permeability as the acid dye and high luminance.

In the case of using the above-described polyaluminum chloride with high basicity, for the lake color material, the peak corresponding to the six-coordinate aluminum is in a sharp shape, and the peak width at a spectral intensity of 0 is narrow. The reason is presumed as follows. In the case of the polyaluminum chloride with high basicity, since the molecular weight of the aluminum oligomer is small, the structure is likely to be relatively uniform, and due to a small cationic valence, the structure of a salt-forming compound of a combination of the polyaluminum chloride and an anion dye is likely to be relatively uniform. Therefore, it is presumed that the particle size distribution of the lake color material is likely to be more uniform, and the lake color material obtains excellent dispersibility (see the solid-state $^{27}Al$-NMR spectrum (a) for the color material of Synthesis Example 1 shown in FIG. 10).

Meanwhile, in the case of using a polyaluminum chloride with low basicity, for the lake color material, the peak corresponding to the six-coordinate aluminum is in a broad shape, and the peak width at a spectral intensity of 0 is wide. The reason is presumed as follows. In the case of the polyaluminum chloride with low basicity, since the molecular weight of the aluminum oligomer is large, the structure is likely to be more non-uniform, and due to a large cationic valence, a wide variety of aluminum atoms in different environments are generated by the method of salt-forming with an anion dye (see the solid-state $^{27}Al$-NMR spectrum (b) for the color material of Comparative Synthesis Example 4 (a polyaluminum chloride with fair average quality was used as a laking agent) in FIG. 10).

Therefore, as an indication of the lake color material in which the above-described polyaluminum chloride with high basicity is used as the laking agent, the following can be used: (1) the peak width at a spectral intensity of 0 of the peak corresponding to the six-coordinate aluminum, which is within a certain range, and (2) the value of the ratio ($I_4/I_6$) which is lower than a certain level. They can be used as an index of the case where a laking reaction with the acid dye is likely to uniformly proceed; the particle size distribution of the lake color material is likely to be more uniform; and the lake color material obtains excellent dispersibility.

Meanwhile, it was found that in the case of using a xanthene-based dye in a color layer of a color filter, even if the xanthene-based dye is laked, the xanthene-based dye can sublime during a high-temperature heating step in color filter production. In light of this finding, more research was made and found the following.

Among xanthene-based dyes, a metal lake color material of a rhodamine-based basic dye and a salt-forming compound of a combination of a rhodamine-based acid dye and a quaternary ammonium salt compound, are likely to sublime. Meanwhile, in the case of using the lake color material obtained by laking the rhodamine-based acid dye with the polyaluminum chloride according to the disclosed embodiments in which the keggin structure is not contained or, even if the keggin structure is contained, the content is small, the lake color material containing the molecular structure derived from the polyaluminum chloride in which the keggin structure is not contained or, even if the keggin structure is contained, the content is small, due to an increase in heat resistance, the color material is inhibited from subliming when heated at high temperature. Meanwhile, in the case of using a lake color material containing the molecular structure derived from the polyaluminum chloride in which the keggin structure is not contained or, even if the keggin structure is contained, the content is small and the peak corresponding to the six-coordinate aluminum is in a sharp shape, due to an increase in heat resistance, the color material is inhibited from subliming when heated at high temperature.

The color material dispersion liquid according to the disclosed embodiments contains at least the color material (A), the dispersant (B) and the solvent (C). It can further contain other components, to an extent that does not impair the effect of the disclosed embodiments.

Hereinafter, the components of the color material dispersion liquid according to the disclosed embodiments, will be described in detail.

[(A) Color Material]

The color material (A) used in the color material dispersion liquid according to the disclosed embodiments, contains a lake color material of a combination of an acid dye and a polyaluminum chloride; a basicity of the polyaluminum chloride is 70% or more; and a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50.

The color material (A) used in the color material dispersion liquid according to the disclosed embodiments, contains a lake color material of a combination of an acid dye and a polyaluminum chloride; a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50; and a peak width at a spectral intensity of 0 of the peak corresponding to the six-coordinate aluminum, is 13 ppm or less. (Hereinafter, these lake color materials may be each referred to as the specific polyaluminum chloride lake color material of the acid dye.)

<Specific Polyaluminum Chloride Lake Color Material of the Acid Dye>

In the disclosed embodiments, the acid dye is a dye that contains at least one of acidic groups (e.g., a sulfo group and a carboxy group) and salts thereof per molecule and that is anionic as the whole molecule. In the specific polyaluminum chloride lake color material of the acid dye, the lake color material is formed by the anion of the acid dye and the cation of the specific, highly basic polyaluminum chloride used as the laking agent.

The lake color material obtained by laking the acid dye with the specific, highly basic polyaluminum chloride used in the disclosed embodiments, contains the molecular structure derived from the polyaluminum chloride in which the keggin structure is not contained or, even if the keggin structure is contained, the content is small. In either a solvent or coating film, the lake color material is dispersed in the form of fine particles. The acid dye in the fine particles aggregates at the molecular level, while forming a salt with the cation in the laking agent.

In a coating film, such a specific polyaluminum chloride lake color material of an acid dye is dispersed in the form of fine particles. Therefore, it provides excellent chemical resistance when it is in the form of a coating film.

(Acid Dye)

The acid dye is not particularly limited. As the acid dye, examples include, but are not limited to, rhodamine-based acid dyes, fluorescein-based acid dyes, anthraquinone-based acid dyes, indigo-based acid dyes, triarylmethane-based acid dyes, phthalocyanine-based acid dyes and azo-based acid dyes.

Conventional metal lake color materials of rhodamine-based basic dyes easily sublimate. However, the specific polyaluminum chloride lake color material of the rhodamine-based acid dye according to the disclosed embodiments, is excellent in color material dispersibility and is inhibited from subliming when heated at high temperature, due to an increase in heat resistance. Therefore, the specific polyaluminum chloride lake color material of the rhodamine-based acid dye is favorably used as the color material according to the disclosed embodiments.

The rhodamine-based acid dye is a derivative of 6-aminoxanthene-3-imine, and it is such an anionic dye that it contains a structure in which at least two hydrogen atoms per molecule are substituted with substituent groups containing at least one of acidic groups (e.g., a sulfo group and a carboxy group) and salts thereof.

Such a rhodamine-based acid dye contains a cationic imine moiety and is anionic as the whole molecule. Therefore, the rhodamine-based acid dye usually contains two or more substituent groups containing at least one of the acidic groups and salts thereof per molecule and contains at least a pair of intramolecular salts (betaine structure). Because of this, it is presumed that such a rhodamine-based acid dye is stabilized to provide excellent heat resistance. Also, since the rhodamine-based acid dye contains at least one anionic acidic group, in addition to the intramolecular salt structure per molecule, it is presumed that when the rhodamine-based acid dye is laked with the highly basic polyaluminum chloride and formed into fine particles, a strong electrical or acid-base interaction occurs both inside and between the molecules of the rhodamine-based dye, thus obtaining excellent heat resistance and inhibiting sublimation.

The rhodamine-based acid dye preferably contains a phenyl group at the 9-position of the xanthene skeleton. The structure represented by the following general formula (II) is preferably used as the rhodamine-based acid dye:

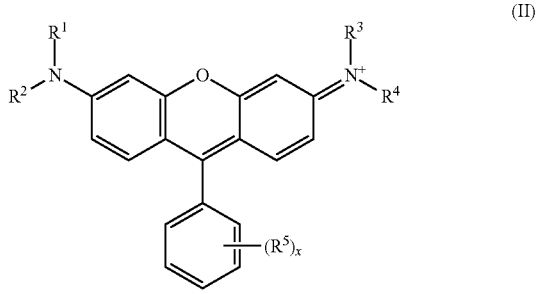

(II)

wherein each of $R^1$, $R^2$, $R^3$ and $R^4$ is independently a hydrogen atom, an alkyl group, an aryl group or a heteroaryl group; $R^1$ and $R^2$ can be bound to form a ring structure, and/or $R^3$ and $R^4$ can be bound to form ring structure; $R^1$ and a carbon atom at the 5-position of the xanthene ring, $R^2$ and a carbon atom at the 7-position of the xanthene ring, $R^3$ and a carbon atom at the 4-position of the xanthene ring, or $R^4$ and a carbon atom at the 2-position of the xanthene ring can be bound to form a ring structure; the hydrogen atom in the aryl or heteroaryl group can be substituted with an acidic group or a salt thereof, or with a halogen atom; $R^5$ is an acidic group or a salt thereof; "x" is an integer of 0 to 5; and the general formula (II) contains at least two acidic groups or salts thereof, and one of the at least two acidic groups or salts thereof forms an intramolecular salt.

The alkyl group as $R^1$ to $R^4$ is preferably a straight- or branched-chain alkyl group which contains 1 to 20 carbon atoms and which can contain a substituent group, more preferably a straight- or branched-chain alkyl group which contains 1 to 8 carbon atoms and which can contain a substituent group, and still more preferably a straight- or branched-chain alkyl group which contains 1 to 5 carbon atoms and which can contain a substituent group. The substituent group that the alkyl group can contain is not particularly limited. As the substituent group, examples include, but are not limited to, an aryl group and a halogen atom. The aryl group can further contain a halogen atom or an acidic group or a salt thereof as a substituent group.

The aryl group as $R^1$ to $R^4$ is preferably an aryl group which contains 6 to 20 carbon atoms and which can contain a substituent group, and more preferably a group which contains a phenyl group, a naphthyl group, etc.

The heteroaryl group as $R^1$ to $R^4$ is preferably a heteroaryl group which contain 5 to 20 carbon atoms and which can contain a substituent group, and it is preferably one containing a nitrogen atom, an oxygen atom and/or a sulfur atom as a heteroatom.

As the substituent group that the aryl or heteroaryl group can contain, examples include, but are not limited to, an alkyl group containing 1 to 5 carbon atoms, a halogen atom, an acidic group or a salt thereof, a hydroxyl group, an alkoxy group, a nitrile group, a carbamoyl group and a carboxylic acid ester group.

"$R^1$ and $R^2$ are bound to form a ring structure, and/or $R^3$ and $R^4$ are bound to form a cyclic structure" means that $R^1$ and $R^2$ form a ring structure through a nitrogen atom, and/or $R^3$ and $R^4$ form a ring structure through a nitrogen atom. The ring structure is not particularly limited. As the ring structure, examples include, but are not limited to, 5- to 7-membered, nitrogen-containing heterocyclic rings. As the heterocyclic rings, examples include, but are not limited to, a pyrrolidine ring, a piperidine ring and a morpholine ring.

"$R^1$ and a carbon atom at the 5-position of the xanthene ring, $R^2$ and a carbon atom at the 7-position of the xanthene ring, $R^3$ and a carbon atom at the 4-position of the xanthene ring, or $R^4$ and a carbon atom at the 2-position of the xanthene ring are bound to form a ring structure" means that a combination of any one of $R^1$ to $R^4$ and a carbon atom at a given position of the xanthene ring each form a ring structure through a nitrogen atom and a part of the xanthene skeleton. The ring structure is not particularly limited. As the ring structure, examples include, but are not limited to, 5- to 7-membered, nitrogen-containing heterocyclic rings.

For the rhodamine-based acid dye represented by the general formula (II), from the viewpoint of increasing light resistance and heat resistance, at least one of $R^1$, $R^2$, $R^3$ and $R^4$ is preferably an aryl group or a heteroaryl group. It is particularly preferable that each of $R^1$ and $R^3$ is independently a hydrogen atom, an alkyl group, an aryl group or a heteroaryl group, and each of $R^2$ and $R^4$ is independently an aryl group or a heteroaryl group. The reason is presumed as follows: when at least one of $R^1$, $R^2$, $R^3$ and $R^4$ is an aryl group or a heteroaryl group, lone electron pairs of the nitrogen atoms to which at least one of $R^1$, $R^2$, $R^3$ and $R^4$ is bound, resonate with not only the xanthene skeleton but also the aryl or heteroaryl groups, thereby stabilizing each molecule.

As the acidic group or salt thereof, examples include, but are not limited to, a carboxy group (—COOH), a carboxylate group (—COO$^-$), a carboxylic acid salt group (—COOM where "M" is a metal atom), a sulfonato group (—SO$_3^-$), a sulfo group (—SO$_3$H) and a sulfonic acid salt group (—SO$_3$M where "M" is a metal atom). It is preferable to contain at least one of a sulfonato group (—SO$_3^-$), a sulfo group (—SO$_3$H) and a sulfonic acid salt group (—SO$_3$M). As the metal atom M, examples include, but are not limited to, a sodium atom and a potassium atom.

The general formula (II) contains at least two acidic groups or salts thereof, and one of them forms an intramolecular salt. In the general formula (II), "x" is preferably a positive number of 1 or 2, and more preferably 1. When "x" is 1, it is preferable that at least one of $R^2$ and $R^4$ contains an acidic group, and it is more preferable that at least one of $R^2$ and $R^4$ is an aryl group containing an acidic group. This is because a reaction between the acidic group and the cation species is efficiently promoted when the acidic group is distantly positioned in each molecule.

As the rhodamine-based acid dye, examples include, but are not limited to, C.I. Acid Red 50, 52, 289 and 388, C.I. Acid Violet 9 and 30, and C.I. Acid Blue 19.

As acid dyes other than the rhodamine-based acid dye, examples include, but are not limited to, the following:

fluorescein-based acid dyes such as C.I. Acid Red 51, 87, 91, 92, 93, 94 and 98, C.I. Acid Orange 11, and C.I. Acid Yellow 73 and 74;

anthraquinone-based acid dyes such as C.I. Acid Red 80, 81, 82 and 83, C.I. Acid Violet 34, 36, 39, 41, 42, 43, 47, 48, 51, 63, 109 and 126, C.I. Acid Blue 23, 25, 27, 35, 40, 41, 43, 45, 46, 47, 49, 51, 52, 53, 55, 56, 62, 68, 69, 78, 80, 81, 96, 111, 124, 127, 127:1, 129, 138, 140, 145, 150, 175, 183, 215, 225, 230, 251, 258, 260, 264, 271, 277, 281, 290, 324, 344 and 350, and C.I. Acid Green 25, 27, 28, 36, 37, 38, 40, 41, 42, 44, 54 and 95;

indigo-based acid dyes such as C.I. Acid Blue 74;

triarylmethane-based acid dyes such as C.I. Acid Violet 15, 16, 17, 19, 21, 23, 24, 25, 38, 49 and 72, C.I. Acid Blue 1, 3, 5, 7, 9, 19, 22, 83, 90, 93, 100, 103, 104 and 109, and C.I. Acid Green 3, 5, 6, 7, 8, 9, 11, 15, 16, 22 and 50;

phthalocyanine-based acid dyes such as C.I. Acid Blue 249 and C.I. Direct Blue 86 and 87;

disazo-based acid dyes such as C.I. Acid Yellow 38, 42, 44, 56, 68, 79, 86, 87, 105, 117, 183, 219 and 228, C.I. Acid Orange 4, 24, 25, 33, 45, 49, 55, 56, 63, 79, 95, 116, 128, 156 and 165, C.I. Acid Red 47, 56, 65, 66, 70, 71, 73, 85, 86, 89, 97, 99, 104, 111, 112, 114, 115, 117, 119, 126, 128, 134, 142, 144, 145, 148, 150, 151, 154, 158, 163, 164, 170, 173, 323, 350, 351, 374 and 444, C.I. Acid Violet 131, C.I. Acid Blue 26, 29, 36, 44, 85, 87, 92, 113, 114, 116, 118, 120, 128 and 352, C.I. Acid Green 19, 20 and 34, C.I. Reactive Yellow 35, 81, 84, 105, 179 and 202, C.I. Reactive Orange 20 and 84, C.I. Reactive Red 120, 141, 152, 221 and 231, C.I. Reactive Blue 40, 109, 171, 194, 213, 214, 222 and 256, C.I. Direct Yellow 4, 12, 13, 15, 24, 25, 31, 33, 34, 41, 42, 44, 50, 51, 52, 67, 69, 70, 72, 73, 74, 83, 86, 117, 118, 120, 130, 132, 134, 138, 142, 162 and 167, C.I. Direct Orange 1, 2, 3, 4, 5, 6, 7, 8, 10, 13, 24, 25, 26, 29, 30, 31, 32, 33, 49, 69, 72, 74, 83, 85, 90, 92, 96, 101, 102, 104, 108 and 118, C.I. Direct Red 2, 4, 6, 7, 8, 10, 13, 14, 15, 16, 17, 18, 21, 22, 23, 24, 26, 28, 29, 31, 33, 34, 36, 37, 39, 42, 43, 44, 46, 49, 50, 52, 53, 54, 55, 56, 57, 59, 60, 61, 62, 63, 67, 68, 72, 73, 74, 75, 77, 79, 81, 83, 85, 88, 89, 90, 98, 99, 101, 108, 110, 117, 120, 121, 122, 127, 130, 141, 148, 149, 150, 152, 153, 154, 155, 156, 169, 173, 174, 176, 180, 181, 185, 186, 189, 191, 220, 224, 227, 239, 243, 250, 253, 257, 259, 260 and 264, C.I. Direct Violet 1, 4, 5, 6, 7, 9, 11, 12, 13, 14, 16, 17, 21, 22, 25, 26, 27, 28, 31, 32, 35, 36, 37, 38, 39, 40, 41, 42, 43, 45, 47, 48, 49, 51, 53, 57, 62, 63, 64, 66, 72, 77, 78, 79, 80, 81, 83, 85, 87, 88, 89, 102 and 103, C.I. Direct Blue 1, 2, 3, 4, 6, 8, 9, 10, 11, 12, 14, 15, 16, 19, 21, 22, 23, 25, 26, 27, 29, 30, 31, 35, 36, 37, 38, 39, 42, 43, 45, 48, 49, 50, 51, 53, 54, 55, 58, 60, 63, 64, 65, 67, 76, 80, 84, 90, 93, 94, 95, 96, 98, 111, 116, 122, 123, 124, 128, 129, 130, 131, 132, 136, 138, 140, 145, 149, 150, 151, 152, 158, 164, 166, 167, 168, 175, 176, 177, 183, 184, 185, 191, 201, 214, 215, 218, 226, 230, 231, 273, 278, 290, 295, 297 and 306, and C.I. Direct Green 1, 3, 6, 7, 8, 9, 10, 11, 12, 13, 19, 20, 21, 22, 34, 38, 39, 42, 49, 55, 57, 58, 60 and 85; and monoazo-based acid dyes such as C.I. Acid Yellow 54, 59, 98, 99, 100, 106, 118, 120, 121, 151, 156, 220, 233, 241, 259, 260 and 262, C.I. Acid Orange 61, 72, 74, 97, 125, 142, 148 and 164, C.I. Acid Red 179, 180, 183, 184, 186, 187, 198, 201, 214, 251, 308, 357, 359, 362, 315, 316, 443, 405 and 407, C.I. Acid Violet 56, 58, 61, 90, 91 and 92, C.I. Acid Blue 42, 70, 154, 155, 158, 161, 169, 193, 198, 284, 317, 335 and 349, C.I. Acid Green 12, 35, 43, 45, 73 and 125, C.I. Reactive Yellow 16, C.I. Reactive Violet 1, 2, 4, 5 and 33, C.I. Reactive Blue 13, 20, 52, 160 and 221, and C.I. Direct Violet 46 and 56.

Preferred monoazo-based acid dyes include metal complex monoazo-based acid dyes which form complex salts with metal atoms such as chromium, cobalt and nickel. As the metal complex monoazo-based acid dyes, examples include, but are not limited to, a 1:1-type metal complex dye (the coupling ratio of metal atoms to dye molecules is 1:1) and a 1:2-type metal complex dye (the ratio is 1:2).

Of the above examples, from the viewpoint of high heat resistance and excellent dispersibility, preferred is at least one kind of acid dye selected from the group consisting of the rhodamine-based acid dye in which at least one aryl or heteroaryl group is bound to at least one of two nitrogens bound to the xanthene skeleton of the rhodamine-based acid dye (i.e., at least one of $R^1$, $R^2$, $R^3$ and $R^4$ in the structure represented by the general formula (II) is an aryl group or a heteroaryl group), the anthraquinone-based acid dyes, the phthalocyanine-based acid dyes, the disazo-based acid dyes and the metal complex monoazo-based acid dyes.

It is presumed that the rhodamine-based acid dye in which at least one aryl or heteroaryl group is bound to at least one of two nitrogens bound to the xanthene skeleton of the rhodamine-based acid dye, anthraquinone-based acid dyes and the phthalocyanine-based acid dyes have a tough skeleton, and the disazo-based acid dyes and the metal complex monoazo-based acid dyes are high in molecular weight and thus high in heat resistance.

Due to high heat resistance and excellent dispersibility, the molecular weight of the acid dye is preferably 610 or more. This is because as the molecular weight increases, crystal growth is inhibited at the time of laking; therefore, small particles are easily produced, and excellent dispersibility and excellent heat resistance are obtained.

(Laking Agent)

In the disclosed embodiments, the polyaluminum chloride used as the laking agent is represented by $Al_n(OH)_mCl_{(3n-m)}$ (where "n" is the number of aluminum atoms, and "m" is the number of hydroxy groups (OH groups)). The basicity of the polyaluminum chloride is defined by $\{(m/3n) \times 100(\%)\}$. As the polyaluminum chloride, one having a high basicity of 70% or more is selected.

In the disclosed embodiments, the polyaluminum chloride used as the laking agent is particularly preferably a polyaluminum chloride represented by the following general formula (II), from the point of view that the color material obtains excellent dispersibility and excellent heat resistance:

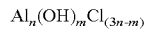
$$Al_n(OH)_mCl_{(3n-m)} \qquad \text{General Formula (II):}$$

wherein "n" is a number of from 2 to 20, and "m" is a number of from 2.1n to (3n−1).

In the polyaluminum chloride represented by the general formula (II), "n" is the number of aluminum atoms and is 2 to 20. By the use of the polyaluminum chloride containing 2 to 20 aluminum atoms, which is a relatively small number, as the laking agent, the dispersed particle diameter of the lake color material according to the disclosed embodiments does not become too large, so that the lake color material obtains excellent dispersibility.

In the disclosed embodiments, "n" is preferably a number of from 2 to 10.

For the polyaluminum chloride represented by the general formula (II), "m" is the number of hydroxy groups (OH groups) and is a number of 2.1n to (3n−1) since the basicity of the polyaluminum chloride is 70% or more.

In the polyaluminum chloride, the aluminum has trivalent cationic property, and the hydroxy groups have monovalent anionic property. Therefore, the polyaluminum chloride has (3n−m)-valent cationic property, as a whole.

In the disclosed embodiments, from the point of view that the color material has strong cohesive force, is easy to collect and is excellent in dispersibility, the basicity of the polyaluminum chloride is preferably higher, and "m" is preferably a number of from 2.1n to (3n−1).

For the polyaluminum chloride represented by the general formula (II), from the point of view that the dispersibility of the color material and the contrast of the coating film are increased, "n" is preferably a number of from 2 to 10, and "m" is preferably a number of from 2.1n to (3n−1).

Also, for the polyaluminum chloride represented by the general formula (II), the basicity defined by $\{(m/3n) \times 100 (\%)\}$ is 70% or more, preferably 76% or more, and more preferably 82% or more, from the following points of view: the heat resistance of the color material is more increased; it is easy to inhibit the color material from subliming; and it is easy to impart excellent dispersibility to the color material. On the other hand, when the basicity is too high, the solubility of the color material in the solvent decreases and makes it difficult to use the color material as the laking agent. Moreover, since the amount of cations per unit weight decreases, the laking agent requirement increases. Therefore, the basicity is preferably 99% or less, more preferably 97% or less, and still more preferably 95% or less.

The basicity of the polyaluminum chloride can be obtained by measuring an aqueous solution of the polyaluminum chloride in accordance with JIS K1475:2006 ("polyaluminum chloride for water supply").

As the polyaluminum chloride used in the disclosed embodiments, a polyaluminum chloride in which the keggin structure is not contained or, even if the keggin structure is contained, the content is small, is used so that the value of the ratio ($I_4/I_6$) between the integral value ($I_4$) of the peak corresponding to the four-coordinate aluminum in the solid-state $^{27}$Al-NMR spectrum of the lake color material and the integral value ($I_6$) of the peak corresponding to the six-coordinate aluminum therein, is from 0 to 0.50. Such a polyaluminum chloride in which the keggin structure is not contained or, even if the keggin structure is contained, the content is small, can be confirmed by measuring the solid-state $^{27}$Al-NMR spectrum after the polyaluminum chloride is changed into solid salt, or by measuring the $^{27}$Al-NMR spectrum of a solution of the polyaluminum chloride dissolved in $D_2O$.

As shown in FIG. 6, in the case of the keggin structure, one aluminum atom present at the center is a four-coordinate aluminum, and 12 aluminum atoms disposed around the center are each a six-coordinate aluminum. Meanwhile, in the case of the straight chain structure, all aluminums are each a six-coordinate aluminum. Therefore, by making the value of the ratio ($I_4/I_6$) lower than a certain level, the keggin structure cannot be contained or, even if the keggin structure is contained, the content is small, and the keggin structure can serve as an indication of the case where the dispersibility of the lake color material is not deteriorated.

Figure 7:
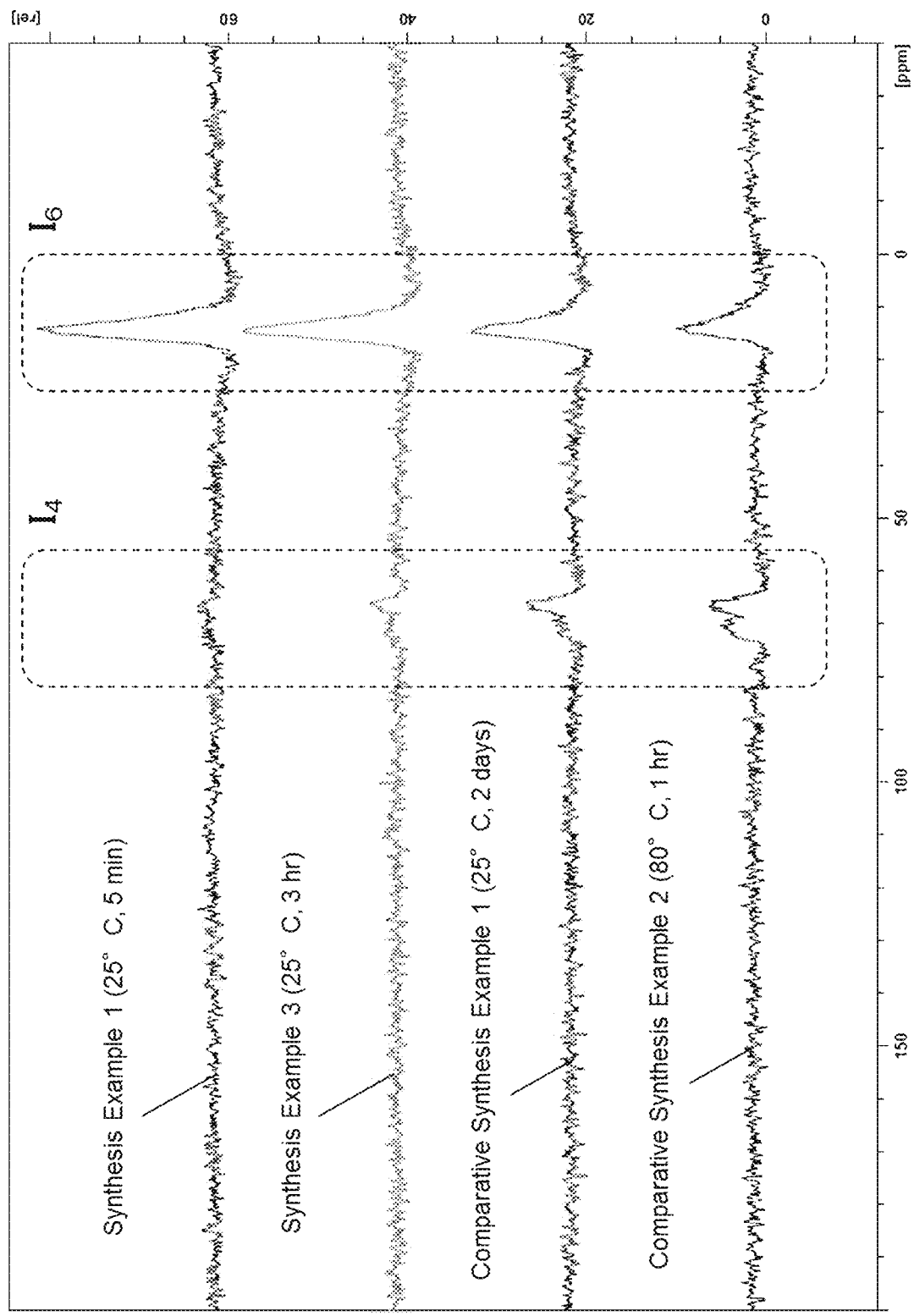
FIG. 7 shows a solid-state $^{27}$Al-NMR spectrum of a color material of Synthesis Example 1, a solid-state $^{27}$Al-NMR spectrum of a color material of Synthesis Example 3, a solid-state $^{27}$Al-NMR spectrum of a color material of Comparative Synthesis Example 1, and a solid-state $^{27}$Al-NMR spectrum of a color material of Comparative Synthesis Example 2.

FIG. 7 shows examples of solid-state $^{27}$Al-NMR spectra of color materials that will be described below under "Examples". Such a peak that the peak top is in a range of from 10 to 20 ppm, is the peak corresponding to the six-coordinate aluminum. Such a peak that the peak top is in a range of from 60 to 70 ppm, is the peak corresponding to the four-coordinate aluminum present at the center of the keggin structure.

By measuring the solid-state $^{27}$Al-NMR spectrum in the measurement conditions that will be described below under "Examples", the value of the ratio ($I_4/I_6$) between the integral value ($I_4$) of such a peak in the solid-state $^{27}$Al-NMR spectrum, that the chemical shift is present in a range of from 50 to 80 ppm, and the integral value ($I_6$) of such a peak that the chemical shift is present in a range of from 0 to 25 ppm, can be calculated.

Even in the $^{27}$Al-NMR spectrum of the solution, the peak corresponding to the six-coordinate aluminum is present in a range of from 0 to 25 ppm, and the peak corresponding to the four-coordinate aluminum present at the center of the keggin structure is present in a range of from 50 to 80 ppm.

In the disclosed embodiments, the value of the ratio ($I_4/I_6$) of the lake color material is 0 or more and 0.50 or less. If the ratio ($I_4/I_6$) is more than 0.50, the dispersibility and contrast of the lake color material largely decrease. The ratio ($I_4/I_6$) is preferably less than 0.40, and more preferably 0.30 or less, from the point of view that the lake color material obtains better dispersibility and higher contrast.

In the case of using the above-described polyaluminum chloride with high basicity, for the lake color material, the peak corresponding to the six-coordinate aluminum is in a sharp shape, and the peak width at a spectral intensity of 0 of the peak corresponding to the six-coordinate aluminum, is narrow (see the solid-state $^{27}$Al-NMR spectrum (a) for the color material of Synthesis Example 1 shown in FIG. 10). The reason is presumed as follows: in the case of the polyaluminum chloride with high basicity, the number of the types of the structures is relatively small since the molecular weight of the aluminum oligomer is small; moreover, due to a small cationic valence, the number of the types of the structures of the salt-forming compound of the combination of the polyaluminum chloride and the anion dye, is relatively small, too.

In the disclosed embodiments, therefore, it can be used as an index of the color material used in the disclosed embodiments, that the peak width at a spectral intensity of 0 of the peak corresponding to the six-coordinate aluminum in the solid-state $^{27}$Al-NMR spectrum of the lake color material, is 13 ppm or less and the value of the ratio ($I_4/I_6$) is 0 or more and 0.50 or less. From the point of view that the color material can easily obtain excellent dispersibility, the peak width at a spectral intensity of 0 of the peak corresponding to the six-coordinate aluminum, is preferably 13 ppm or less, more preferably 11 ppm or less, and still more preferably 10 ppm or less.

By measuring the solid-state $^{27}$Al-NMR spectrum in the conditions that will be described below under "Examples" and then measuring the peak width at a spectral intensity of 0 of such a peak that the peak top of the chemical shift is present in a range of from 0 to 25 ppm, the peak width at a spectral intensity of 0 of the peak corresponding to the six-coordinate aluminum, can be obtained.

The specific polyaluminum chloride lake color material of the acid dye can be obtained by mixing, in a solvent, a desired acid dye and the polyaluminum chloride in which the basicity is 70% or more and the keggin structure is not contained or, even if the keggin structure is contained, the content is small.

As the mixing method, examples include, but are not limited to, the following methods: (1) a method in which a desired acid dye solution and a laking agent solution containing the polyaluminum chloride with a basicity of 70% or more, are separately prepared, and the dye solution and the laking agent solution are mixed together, with heating or cooling as needed, and (2) a method in which a desired acid dye and the polyaluminum chloride with a basicity of 70% or more, are added to a solvent in which the acid dye and the polyaluminum chloride with a basicity of 70% or more serving as the laking agent are soluble, and they are stirred and mixed together, with heating or cooling as needed.

The polyaluminum chloride in which the basicity is 70% or more and the keggin structure is not contained or, even if the keggin structure is contained, the content is small, can be obtained by preparing the polyaluminum chloride with a basicity of 70% or more and, at the time of preparing the laking agent solution or mixing the polyaluminum chloride with the acid dye, preparing the polyaluminum chloride in the condition in which the keggin structure is hardly produced. In particular, for example, it is preferable that ion-exchanged water at a temperature of from 0 to 30° C., is mixed with the polyaluminum chloride with a basicity of 70% or more, and the mixture is mixed with an acid dye solution within 24 hours, preferably 12 hours. As the temperature of the ion-exchanged water used to dilute the polyaluminum chloride increases, the keggin structure is produced more quickly. Therefore, it is preferable to mix them in a very short time from the dilution.

At the time of laking, the reaction temperature is not particularly limited. When water is used as the solvent, the reaction temperature can be 5 to 90° C.

The acid dye such as the rhodamine-based acid dye can be synthesized by reference to a known synthesis method such as the synthesis method described in "Shin senryo kagaku" (author: Yutaka Hosoda, publisher: Gihodo Shuppan Co., Ltd.) Or, a commercially-available product can be used as the acid dye.

The color material according to the disclosed embodiments is a lake color material of a combination of an acid dye and a polyaluminum chloride with a basicity of 70% or more, and a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50. As described above, the color material according to the disclosed embodiments is excellent in dispersibility, because it contains the molecular structure derived from the polyaluminum chloride in which the basicity is 70% or more and the keggin structure is not contained or, even if the keggin structure is contained, the content is small.

The color material according to the disclosed embodiments is a lake color material of a combination of an acid dye and a polyaluminum chloride; a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50; and a peak width at a spectral intensity of 0 of the peak corresponding to the six-coordinate aluminum, is 13 ppm or less. As described above, the color material according to the disclosed embodiments is excellent in dispersibility, because it contains the molecular structure derived from the polyaluminum chloride in which the keggin structure is not contained or, even if the keggin structure is contained, the content is small, and the peak corresponding to the six-coordinate aluminum is in a sharp shape.

Especially in the case where the color material according to the disclosed embodiments is the specific polyaluminum chloride lake color material of the rhodamine-based acid dye, due to an increase in heat resistance, the color material is inhibited from subliming when heated at high temperature.

The color material according to the disclosed embodiments can be suitably used for not only color filter application but also printing application, color toner application and coating application. When the acid dye is a UV absorbing dye, the color material according to the disclosed embodiments can be suitably used as a UV absorbing material. When the acid dye is an infrared absorbing dye, the color material can be suitably used as an infrared absorbing material. When the acid dye is a food dye or tar dye, the color material can be suitably used in cosmetics, foods, drugs and medicines, etc.

<Other Color Material>

In order to adjust color tone, the color material (A) used in the disclosed embodiments can further contain other color material, to the extent that does not impair the effects of the disclosed embodiments. As the other color material, examples include, but are not limited to, known pigments and dyes. The other color material is not particularly limited and can be the same as the case of the below-described color resin composition, as long as the effects of the disclosed embodiments are not impaired.

In the disclosed embodiments, it is preferable that the color material (A) further contains a color material represented by the following general formula (I), from the viewpoint of obtaining a color material dispersion liquid being excellent in dispersibility and being capable of forming a high-contrast, high-luminance coating film with a desired controlled color tone. From the point of view that a high-contrast, high-luminance coating film can be formed, it is particularly preferable to use the specific polyaluminum chloride lake color material of the rhodamine-based acid dye in combination with the color material represented by the following general formula (I):

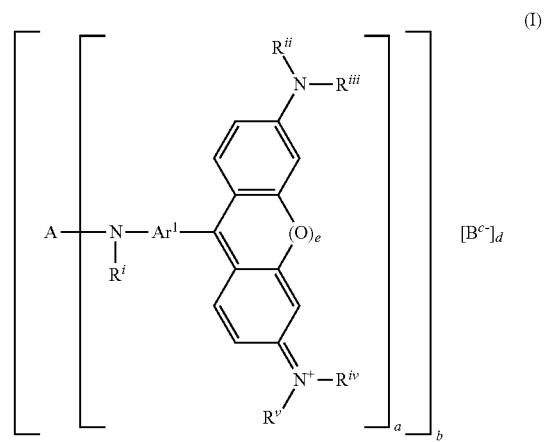

wherein the symbols in the general formula (I) are as described above.

The cationic moiety in the color material represented by the general formula (I) can be the same as the cationic moiety in the color material represented by the general formula (I) described in International Publication No. WO2012/144521.

In the general formula (I), "A" is an "a"-valent organic group in which a carbon atom directly bound to "N" (nitrogen atom) contains no π bond. The organic group is an aliphatic hydrocarbon group containing a saturated aliphatic hydrocarbon group at least at a terminal position directly bound to "N", or an aromatic group containing the aliphatic hydrocarbon group, and O (oxygen atom), S (sulfur atom), N (nitrogen atom) can be contained in a carbon chain of the organic group. Since the carbon atom directly bound to "N" contains no π bond, the color characteristics of the cationic color-forming moiety, such as color tone and transmittance, are not affected by the linking group A and other color-forming moieties, thereby allowing the same color as that of a single color-forming moiety.

In "A", as long as the carbon atom being at the terminal position and directly bound to "N" contains no π bond, the aliphatic hydrocarbon group containing a saturated aliphatic hydrocarbon group at least at a terminal position directly bound to "N", can be in a straight-chain, branched-chain or cyclic form, contain an unsaturated bond in carbon atoms except the one in the terminal position, contain a substituent group, or contain O, S, N in the carbon chain. For example, a carbonyl group, a carboxyl group, an oxycarbonyl group and/or an amide group can be contained, and a hydrogen atom can be substituted by a halogen atom, etc.

Also in "A", as the aromatic group containing an aliphatic hydrocarbon group, examples include, but are not limited to, a monocyclic or polycyclic aromatic group which contains an aliphatic hydrocarbon group containing a saturated aliphatic hydrocarbon group at least at the terminal position directly bound to "N". The aromatic group can contain a substituent group, and it can be a heterocyclic ring containing O, S, N.

Particularly, from the viewpoint of skeleton toughness, it is preferable that "A" contains a cyclic aliphatic hydrocarbon group or an aromatic group.

As the cyclic aliphatic hydrocarbon group, a bridged alicyclic hydrocarbon group is particularly preferred from the viewpoint of skeleton toughness. The bridged alicyclic hydrocarbon group refers to a polycyclic aliphatic hydrocarbon group containing a bridged structure in the aliphatic ring and containing a polycyclic structure. As the bridged alicyclic hydrocarbon group, examples include, but are not limited to, norbornane, bicyclo[2,2,2]octane, dicyclopentadiene and adamantane. Of bridged alicyclic hydrocarbon groups, norbornane is preferred. As the aromatic group, examples include, but are not limited to, groups containing a benzene ring and those containing a naphthalene ring. Of them, groups containing a benzene ring are preferred.

From the viewpoint of ease of availability of raw materials, "A" is preferably divalent to tetravalent, more preferably divalent or trivalent, and still more preferably divalent. For example, when "A" is a divalent organic group, as the divalent organic group, examples include, but are not limited to, a straight-chain, branched-chain or cyclic alkylene group containing 1 to 20 carbon atoms, and an aromatic group in which two alkylene groups each containing 1 to 20 carbon atoms are bound by substitution, such as a xylylene group.

The alkyl group as $R^i$ to $R^v$ is not particularly limited. As the alkyl group, examples include, but are not limited to, a straight- or branched-chain alkyl group containing 1 to 20 carbon atoms. Of them, preferred is a straight- or branched-chain alkyl group containing 1 to 8 carbon atoms, and more preferred is a straight- or branched-chain alkyl group containing 1 to 5 carbon atoms, from the viewpoint of ease of production and availability of raw materials. Of them, still more preferred is an ethyl group or a methyl group. A substituent group that the alkyl group can contain is not particularly limited. As the substituent group, examples include, but are not limited to, an aryl group, a halogen atom and a hydroxyl group. As the substituted alkyl group, examples include, but are not limited to, a benzyl group.

The aryl group as $R^i$ to $R^v$ is not particularly limited. As the aryl group, examples include, but are not limited to, a phenyl group and a naphthyl group. As a substituent group that the aryl group can contain, examples include, but are not limited to, an alkyl group and a halogen atom.

"$R^{ii}$ and $R^{iii}$ can be bound to form a ring structure, and/or $R^{iv}$ and $R^v$ can be bound to form a ring structure" means that $R^{ii}$ and $R^{iii}$ form a ring structure through a nitrogen atom, and/or $R^{iv}$ and $R^v$ form a ring structure through a nitrogen atom. The ring structure is not particularly limited, and as the ring structure, examples include, but are not limited to, a pyrrolidine ring, a piperidine ring and a morpholine ring.

Especially from the viewpoint of chemical stability, it is preferable that each of $R^i$ to $R^v$ is independently a hydrogen atom, an alkyl group containing 1 to 5 carbon atoms, or a phenyl group. Or, it is preferable that $R^{ii}$ and $R^{iii}$ are bound to form a pyrrolidine ring, a piperidine ring or a morpholine ring, and/or $R^{iv}$ and $R^v$ are bound to form a pyrrolidine ring, a piperidine ring or a morpholine ring.

Each of $R^i$ to $R^v$ can independently contain the above structure. Particularly, from the viewpoint of color purity, it is preferable that $R^i$ is a hydrogen atom. From the viewpoint of ease of production and availability of raw materials, it is more preferable that all of $R^{ii}$ to $R^v$ are the same.

The divalent aromatic group as $Ar^1$ is not particularly limited. The aromatic group can be an aromatic hydrocarbon group composed of a carbon ring, or a heterocyclic group. As the aromatic hydrocarbon in the aromatic hydrocarbon group, examples include, but are not limited to, a benzene ring; condensed polycyclic aromatic hydrocarbon such as a naphthalene ring, a tetralin ring, an indene ring, a fluorene ring, an anthracene ring and a phenanthrene ring; and chain polycyclic hydrocarbons such as biphenyl, terphenyl, diphenylmethane, triphenylmethane and stilbene. The chain polycyclic hydrocarbons can contain O, S, N in the chain skeleton, such as diphenyl ether. Meanwhile, as the heterocyclic ring in the heterocyclic group, examples include, but are not limited to, 5-membered heterocyclic rings such as furan, thiophene, pyrrole, oxazole, thiazole, imidazole and pyrazole; 6-membered heterocyclic rings such as pyran, pyrone, pyridine, pyrone, pyridazine, pyrimidine and pyrazine; and condensed polycyclic heterocyclic rings such as benzofuran, thionaphthene, indole, carbazole, coumarin, benzo-pyrone, quinoline, isoquinoline, acridine, phthalazine, quinazoline and quinoxaline. These aromatic groups can contain a substituent group.

As the substituent group that the aromatic group can contain, examples include, but are not limited to, an alkyl group containing 1 to 5 carbon atoms and a halogen atom.

$Ar^1$ is preferably an aromatic group containing 6 to 20 carbon atoms, and more preferably an aromatic group containing a condensed polycyclic carbon ring containing 10 to 14 carbon atoms. $Ar^1$ is still more preferably a phenylene group or a naphthylene group, from the point of view that the structure is simple and the raw materials are low-cost.

A plurality of $R^i$s per molecule can be the same or different; a plurality of $R^{ii}$s per molecule can be the same or different; a plurality of $R^{iii}$s per molecule can be the same or different; a plurality of $R^{iv}$s per molecule can be the same or different; a plurality of $R^v$s per molecule can be the same or different; and a plurality of $Ar^1$s per molecule can be the same or different. The color-forming moieties show the same color when, in all of the moieties, $R^i$s are the same; $R^{ii}$s are the same; $R^{iii}$s are the same; $R^{iv}$s are the same; $R^v$s are the same; and $Ar^1$s are the same. In this case, therefore, the color material can reproduce the same color as that of a single color-forming moiety, which is preferred from the viewpoint of color purity. On the other hand, in the case where at least one of $R^i$ to $R^v$ and $Ar^1$ is a different substituent group, it is possible to reproduce a color obtained from a mixture of several kinds of color-forming moieties, so that it is possible to produce a desired color.

The anion ($B^{c-}$) in the color material represented by the general formula (I) is a divalent or higher polyoxometalate anion. The polyoxometalate anion can be isopolyoxometalate ion $(M_mO_n)^{d-}$ or heteropolyoxometalate ion $(X_iM_mO_n)^{d-}$. In the ionic formulae, "M" is a polyatom; "X" is a heteroatom; "m" is the compositional ratio of the polyatom; and "n" is the compositional ratio of the oxygen atom. As the polyatom (M), examples include, but are not limited to, Mo, W, V, Ti and Nb. As the heteroatom (X), examples include, but are not limited to, Si, P, As, S, Fe and Co. A counter cation such as $Na^+$ or $H^+$ can be contained in a part of the polyoxometalate anion.

From the viewpoint of high luminance and excellent heat resistance and light resistance, preferred is a polyoxometalate anion containing at least one of tungsten (W) and molybdenum (Mo). From the viewpoint of heat resistance, more preferred is a polyoxometalate anion which contains at least tungsten and which can contain molybdenum.

As the polyoxometalate anion containing at least one of tungsten (W) and molybdenum (Mo), examples include, but are not limited to, a tungstate ion $[W_{10}O_{32}]^{4-}$ and a molybdate ion $[Mo_6O_{19}]^{2-}$, which are isopolyoxometalates, and phosphotungstate ions $[PW_{12}O_{40}]^{3-}$ and $[P_2W_{18}O_{62}]^{6-}$, a silicotungstate ion $[SiW_{12}O_{40}]^{4-}$, a phosphomolybdate ion $[PMo_{12}O_{40}]^{3-}$, a silicomolybdate ion $[SiMo_{12}O_{40}]^{4-}$, phosphotungstic molybdate ions $[PW_{12-x}Mo_xO_{40}]^{3-}$ (where x is an integer of 1 to 11) and $[P_2W_{18-y}Mo_yO_{62}]^{6-}$ (where y is an integer of 1 to 17) and a silicotungstic molybdate ion $[SiW_{12-x}Mo_xO_{40}]^{4-}$ (where x is an integer of 1 to 11), which are all heteropolyoxometalates. Of these examples, from the viewpoint of heat resistance and availability of raw materials, the polyoxometalate anion containing at least one of tungsten (W) and molybdenum (Mo) is preferably a heteropolyoxometalate, and more preferably a heteropolyoxometalate containing phosphorus (P).

In the polyoxometalate anion containing at least tungsten (W), the content ratio of the tungsten to molybdenum is not particularly limited. Particularly from the viewpoint of excellent heat resistance, the molar ratio of the tungsten to molybdenum is preferably from 100:0 to 85:15, and more preferably from 100:0 to 90:10.

As the polyoxometalate anion ($B^{c-}$), the above-mentioned polyoxometalate anions can be used alone or in combination of two or more kinds. In the case of using a combination of two or more kinds of the above-mentioned polyoxometalate anions, the molar ratio of the tungsten to molybdenum in the whole polyoxometalate anion is preferably in the above range.

The color material represented by the general formula (I) can be a double salt that further contains other cation or anion, to an extent that does not impair the effect of the disclosed embodiments. As the cation, examples include, but are not limited to, other basic dyes; organic compounds containing a functional group that can form a salt with an anion, such as an amino group, a pyridine group or an imidazole group; and metal ions such as a sodium ion, a potassium ion, a magnesium ion, a calcium ion, a copper ion and an iron ion. As the anion, examples include, but are not limited to, acid dyes, halide ions such as a fluoride ion, a chloride ion and a bromide ion, and inorganic acid anions. As the inorganic acid anions, examples include, but are not limited to, oxo acid anions such as a phosphate ion, a sulfate ion, a chromate ion, a tungstate ion ($WO_4^{2-}$) and a molybdate ion ($MoO_4^{2-}$).

The average dispersed particle diameter of the color material (A) used in the disclosed embodiments, is not particularly limited, as long as a desired color can be obtained when the color material is formed into the color layer of a color filter. From the viewpoint of obtaining excellent dispersibility, increasing contrast and luminance, and obtaining excellent heat resistance and light resistance, the average dispersed particle diameter is preferably in a range of from 10 to 300 nm, and more preferably in a range of from 20 to 200 nm. By setting the average dispersed particle diameter of the color material (A) within the range, the liquid crystal display device and light-emitting display device produced by the use of the color material dispersion liquid or color material dispersion liquid for a color filter according to the disclosed embodiments, can obtain high contrast and high quality.

The average dispersed particle diameter of the color material (A) in the color material dispersion liquid is the dispersed particle diameter of the color material particles dispersed in a dispersion medium that contains at least a solvent, and it is measured with a laser scattering particle size distribution analyzer. The average dispersed particle diameter can be measured as follows with a laser scattering particle size distribution analyzer: the color material dispersion liquid is appropriately diluted with the solvent used for the color material dispersion liquid to a concentration that is measurable with a laser scattering particle size distribution analyzer (e.g., 1,000-fold) and then measured with a laser scattering particle size distribution analyzer (e.g., Nanotrac Particle Size Analyzer UPA-EX150 manufactured by MicrotracBEL Corp.) by a dynamic light scattering method at 23° C. This average dispersed particle diameter is a volume average particle diameter.

In the color material dispersion liquid according to the disclosed embodiments, the content of the color material is not particularly limited. From the viewpoint of dispersibility and dispersion stability, the content of the color material is preferably in a range of from 3 to 40% by mass, and more preferably in a range of from 5 to 20% by mass, with respect to the total amount of the color material dispersion liquid.

Also in the color material dispersion liquid according to the disclosed embodiments, in the case of mixing the specific polyaluminum chloride lake color material of the acid dye with the color material represented by the general formula (I), the mixing ratio can be appropriately determined, in order to obtain a desired color tone, and it is not particularly limited. From the viewpoint of color control in the case of using the color material to form a blue color layer for a color filter, the mass ratio of the specific polyaluminum chloride lake color material of the acid dye to the color material represented by the general formula (I) is preferably from 50:50 to 1:99, and more preferably from 30:70 to 5:95.

[(B) Dispersant]

In the color material dispersion liquid according to the disclosed embodiments, the color material (A) is dispersed in the solvent by the dispersant (B) for use. The dispersant (B) can be appropriately selected from those that are conventionally used as dispersants. As the dispersant, examples include, but are not limited to, surfactants such as cationic, anionic, nonionic, amphoteric, silicone-based and fluorine-based surfactants. Of surfactants, a polymer surfactant (a polymer dispersant) is preferred from the point of view that it can homogeneously and finely disperse the color material. As the dispersant (B), these dispersants can be used alone or in combination of two or more kinds.

As the polymer dispersant, examples include, but are not limited to, (co)polymers of unsaturated carboxylic acid esters such as polyacrylic acid ester; (partial) amine salts, (partial) ammonium salts and (partial) alkylamine salts of (co)polymers of unsaturated carboxylic acids such as polyacrylic acid; (co)polymers of hydroxyl group-containing unsaturated carboxylic acid esters such as hydroxyl group-containing polyacrylic acid ester, and modified products thereof; polyurethanes; unsaturated polyamides; polysiloxanes; long-chain polyaminoamide phosphates; polyethyleneimine derivatives (amide and salts thereof, obtained by reaction of poly(lower alkyleneimine) and polyester containing a free carboxyl group); and polyallylamine derivatives (reaction products obtained by reaction of polyallylamine and one or more compounds selected from the group consisting of the following three kinds of compounds: polyester containing a free carboxyl group, polyamide, and a co-condensate of ester and amide (polyester amide)).

Commercially-available products of such dispersants include Disperbyk-2000 and 2001, and BYK-LPN 6919, 21116 and 21324 (product names, manufactured by BYK Japan KK) and AJISPER PB821 and 881 (product names, manufactured by Ajinomoto Fine-Techno. Co., Inc.), for example. Of them, BYK-LPN 6919 and 21116 are preferred from the viewpoint of heat resistance, electric reliability and dispersibility.

From the point of view that the color material (A) can be appropriately dispersed and excellent dispersion stability can be achieved, the polymer dispersant is particularly preferably one or more kinds selected from the group consisting of a polymer containing at least a constitutional unit represented by the following general formula (III) and urethane-based dispersants composed of compounds containing one or more urethane bonds (—NH—COO—) per molecule.

Hereinafter, the preferred dispersant will be described in detail.

<Polymer containing at least a Constitutional Unit Represented by the following General Formula (III)>

In the disclosed embodiments, a polymer containing at least a constitutional unit represented by the following general formula (III) can be preferably used as the dispersant (B):

wherein $R^{11}$ is a hydrogen atom or a methyl group; "A" is a direct bond or a divalent linking group; "Q" is a group represented by the following general formula (III-a) or a nitrogen-containing heterocyclic group which can form a salt and which can contain a substituent group:

wherein each of $R^{12}$ and $R^{13}$ is independently a hydrogen atom or a hydrocarbon group which can contain a heteroatom, and $R^{12}$ and $R^{13}$ can be the same or different from each other.

In the general formula (III), "A" is a direct bond or a divalent linking group. The direct bond means that "Q" is directly bound to a carbon atom in the general formula (III), not through a linking group.

As the divalent linking group as "A", examples include, but are not limited to, an alkylene group containing 1 to 10 carbon atoms, an arylene group, a —CONH— group, a —COO— group, an ether group containing 1 to 10 carbon atoms (—R'—OR"— where each of R' and R" is independently an alkylene group) and combinations thereof.

From the viewpoint of dispersibility, "A" in the general formula (III) is preferably a direct bond or a divalent linking group containing a —CONH— group or a —COO— group.

The above dispersants can be particularly preferably used by allowing the constitutional unit represented by the general formula (III) of the dispersants to form a salt by the below-described salt forming agent, at a desired ratio.

As the polymer containing the constitutional unit represented by the general formula (III), block and graft copolymers containing structures disclosed in International Publication No. WO2011/108495 and Japanese Patent Application Laid-Open (JP-A) Nos. 2013-054200, 2010-237608 and 2011-75661 are particularly preferred, from the point of view that the dispersibility and dispersion stability of the color material and the heat resistance of the resin composition can be increased, and a high-luminance and high-contrast color layer can be formed.

Commercially-available products of the polymers containing the constitutional unit represented by the general formula (III) include BYK-LPN 6919.

(Salt Forming Agent)

In the disclosed embodiments, the dispersant is preferably a polymer in which at least a part of a nitrogen site of the constitutional unit represented by the general formula (III) forms a salt (hereinafter, this state may be referred to as "salt-modified").

In the disclosed embodiments, by allowing the nitrogen site of the constitutional unit represented by the general formula (III) to form a salt using the salt forming agent, the dispersant strongly adsorbs to the color material similarly forming a salt, so that the dispersibility and dispersion stability of the color material are increased. As the salt forming agent, acidic organophosphorus compounds, organic sulfonic acid compounds and quaternizing agents, which are disclosed in International Publication No. WO2011/108495 and JP-A No. 2013-054200, can be preferably used. Especially when the salt forming agent is an acidic organophosphorus compound, salt-forming moieties containing the acidic organophosphorus compound of the dispersant are localized on the surface of the color material particles, and thus the color material surface reaches a state of being covered with phosphate. Therefore, attacks on the dye skeleton of the color material by active oxygen (hydrogen abstraction) are inhibited, so that the heat resistance and light resistance of the color material containing the dye skeleton are increased. For this reason, color deterioration by high-temperature heating can be further inhibited by the use of the polymer salt-modified by the acidic organophosphorus compound as the dispersant, while the color material (A) with high transmittance used in the disclosed embodiments is in a state of being sufficiently dispersed. Therefore, a color layer which shows higher luminance even after it undergoes the high-temperature heating of the color filter production step, can be formed.

<Urethane-Based Dispersant>

The urethane-based dispersant that is preferably used as the dispersant, is a dispersant composed of a compound containing one or more urethane bonds (—NH—COO—) per molecule.

Excellent dispersion is possible by the use of a small amount of the urethane-based dispersant. By making the amount of the dispersant small, the amount of a cure component, etc., can be relatively large. As a result, a color layer with excellent heat resistance can be formed.

In the disclosed embodiments, the urethane-based dispersant is preferably a reaction product of (1) polyisocyanates containing two or more isocyanate groups per molecule and (2) one or more kinds selected from polyesters containing a hydroxyl group at a single terminal or both terminals thereof and poly(meth) acrylates containing a hydroxyl group at a single terminal or both terminals thereof. The urethane-based dispersant is more preferably a reaction product of (1)

polyisocyanates containing two or more isocyanate groups per molecule, (2) one or more kinds selected from polyesters containing a hydroxyl group at a single terminal or both terminals thereof and poly(meth) acrylates containing a hydroxyl group at a single terminal or both terminals thereof, and (3) a compound containing an active hydrogen and a basic or acidic group per molecule.

Commercially-available, urethane-based dispersants include Disperbyk-161, 162, 163, 164, 167, 168, 170, 171, 174, 182, 183, 184 and 185, and BYK-9077 (product names, manufactured by BYK Japan KK), AJISPER PB711 (product name, manufactured by Ajinomoto Fine-Techno. Co., Inc.) and EFKA-46, 47 and 48 (product names, manufactured by EFKA CHEMICALS). Of them, Disperbyk-161, 162, 166, 170 and 174 are preferred from the viewpoint of heat resistance, electric reliability and dispersibility.

As the dispersant (B), these dispersants can be used alone or in combination of two or more kinds.

In the color material dispersion liquid according to the disclosed embodiments, from the viewpoint of dispersibility, dispersion stability and film properties, generally, the content of the dispersant (B) is preferably in a range of from 1 to 50% by mass, and more preferably in a range of from 1 to 20% by mass, with respect to the total amount of the color material dispersion liquid.

[(C) Solvent]

In the disclosed embodiments, the solvent (C) can be appropriately selected from solvents which are unreactive with components in the color material dispersion liquid or in the below-described color resin composition and which can dissolve or disperse them. As the solvent (C), examples include, but are not limited to, organic solvents such as alcohol-based solvents, ether alcohol-based solvents, ester-based solvents, ketone-based solvents, ether alcohol acetate-based solvents, ether-based solvents, aprotic amide-based solvents, lactone-based solvents, unsaturated hydrocarbon-based solvents and saturated hydrocarbon-based solvents. Of them, ester-based solvents are preferred from the viewpoint of solubility upon dispersion and coating properties.

Preferred ester-based solvents include methyl methoxypropionate, ethyl ethoxypropionate, methoxy ethyl acetate, propylene glycol monomethyl ether acetate, 3-methoxy-3-methyl-1-butyl acetate, 3-methoxybutyl acetate, methoxybutyl acetate, ethoxy ethyl acetate, ethyl cellosolve acetate, dipropylene glycol methyl ether acetate, propylene glycol diacetate, 1,3-butylene glycol diacetate, cyclohexanol acetate, 1,6-hexanediol diacetate, diethylene glycol monoethyl ether acetate, and diethylene glycol monobutyl ether acetate, for example.

Of them, propylene glycol monomethyl ether acetate (PGMEA) is preferred from the point of view that it has a low risk to the human body and has fast heat-drying properties although it has low volatility at around room temperature. In this case, there is such an advantage that a special washing step is not needed when switching from a color material dispersion liquid comprising conventional PGMEA.

These solvents can be used alone or in combination of two or more kinds.

The color material dispersion liquid according to the disclosed embodiments is prepared by the use of the solvent (C) generally in an amount of from 45 to 95% by mass, and the amount of the solvent (C) used is preferably from 60 to 90% by mass, with respect to the total amount of the color material dispersion liquid. As the solvent amount decreases, the viscosity increases and the dispersibility decreases. As the solvent amount increases, the color material concentration decreases and may result in a difficulty in achieving a target chromaticity coordinate after preparation of the color resin composition.

(Other Components)

The color material dispersion liquid according to the disclosed embodiments can further contain a dispersion assisting resin and other components as needed, as long as the effect of the disclosed embodiments are not impaired.

As the dispersion assisting resin, examples include, but are not limited to, an alkali soluble resin that will be mentioned below under "Color resin composition". The particles of the color material becomes less likely to contact with each other due to steric hindrance by the alkali soluble resin, resulting in stabilization of particle dispersion, and the particle dispersion stabilization effect may be effective in reducing the dispersant.

As the other components, examples include, but are not limited to, a surfactant, which is used to increase wettability, a silane coupling agent, which is used to increase adhesion properties, a defoaming agent, a cissing inhibitor, an antioxidant, an aggregation inhibitor and an ultraviolet absorber.

The color material dispersion liquid according to the disclosed embodiments is used as a preliminarily prepared product for preparing the below-described color resin composition. That is, the color material dispersion liquid is such a color material dispersion liquid that it is preliminarily prepared at a stage prior to preparing the below-described color resin composition and the ratio of "the mass of the color material component in the composition"/"the mass of the solid content other than the color material component in the composition" is high. In particular, this ratio ("the mass of the color material component in the composition"/"the mass of the solid content other than the color material component in the composition" ratio) is generally 0.3 or more, preferably 0.5 or more, and still more preferably 1.0 or more. By mixing the color material dispersion liquid with at least a binder component, a color resin composition with excellent dispersibility can be prepared.

<Method for Producing the Color Material Dispersion Liquid>

In the disclosed embodiments, the method for producing the color material dispersion liquid can be a method which can contain the color material (A), the dispersant (B), the solvent (C) and various kinds of additional components used as needed, and which can homogeneously disperse the color material (A) in the solvent by the dispersant. The color material dispersion liquid can be prepared by mixing them with a known mixing means.

The color material dispersion liquid can be prepared by the following method: the dispersant (B) is mixed with the solvent (C) and stirred to produce a dispersant solution; the dispersant solution is mixed with the color material (A) and, as needed, other component; and the mixture is dispersed with a known stirrer or disperser, thereby preparing the dispersion liquid. Also, the color material dispersion liquid according to the disclosed embodiments can be prepared as follows: a color material dispersion liquid in which the specific polyaluminum chloride lake color material of the acid dye is dispersed and a color material dispersion liquid in which other color material is dispersed, are separately prepared and mixed together, thereby preparing the color material dispersion liquid of the disclosed embodiments.

As the disperser used for the dispersion treatment, examples include, but are not limited to, roller mills such as a two-roller mill and a three-roller mill; ball mills such as a vibrating ball mill; paint conditioners; and bead mills such as a continuous disk type bead mill and a continuous annular type bead mill. In the case of using a bead mill, a preferred dispersion condition is that the diameter of the beads used is from 0.03 to 2.00 mm, and more preferably from 0.10 to 1.0 mm.

In particular, a preparatory dispersion is carried out with 2 mm zirconia beads, which is a relatively large bead diameter, and then a main dispersion is further carried out with 0.1 mm zirconia beads, which is a relatively small bead diameter. It is preferable to carry out filtration with a 0.5 to 5.0 μm membrane filter after the dispersion treatment.

The color material dispersion liquid according to the disclosed embodiments can be suitably used for not only color filter application but also printing application, color toner application and coating application. When the rhodamine-based acid dye is a UV absorbing dye, the color material dispersion liquid according to the disclosed embodiments can be suitably used as a UV absorbing material. When the rhodamine-based acid dye is an infrared absorbing dye, the color material dispersion liquid according to the disclosed embodiments can be suitably used as an infrared absorbing material. When the rhodamine-based acid dye is a food dye or tar dye, the color material dispersion liquid according to the disclosed embodiments can be suitably used in cosmetics, foods, drugs and medicines, etc.

2. Color Resin Composition

In another embodiment, there is provided a color resin composition comprising the color material dispersion liquid according to the disclosed embodiments and (D) a binder component.

That is, a color resin composition comprising (A) a color material, (B) a dispersant, (C) a solvent and (D) a binder component, wherein the color material (A) contains the specific polyaluminum chloride lake color material of the acid dye, can be provided. The color resin composition according to the disclosed embodiments is excellent in dispersibility and heat resistance and is capable of forming a high-contrast, high-luminance color layer. Especially from the viewpoint of being inhibited from subliming when heated at high temperature and being capable of forming a high-contrast, high-luminance color filter with excellent heat resistance, it is preferable to use the specific polyaluminum chloride lake color material of the rhodamine-based acid dye as the color material (A), and it is more preferable to use the combination of the specific polyaluminum chloride lake color material of the rhodamine-based acid dye and the color material represented by the general formula (I) as the color material (A). The color resin composition according to the disclosed embodiments can be a color resin composition for a color filter.

The color resin composition contains the color material (A), the dispersant (B), the solvent (C) and the binder component (D), and it can contain other components as needed.

Hereinafter, the color resin composition will be described. However, the color material (A), the dispersant (B) and the solvent (C) will not be described below, since they can be the same as those of the above-described color material dispersion liquid according to the disclosed embodiments.

[(D) Binder Component]

To provide film-forming properties and surface adhesion properties, the color resin composition contains a binder component. Especially, to provide sufficient hardness to coating films, the color resin composition preferably contains a curable binder component. The curable binder component is not particularly limited, and conventionally-known curable binder components that are used to form the color layers of color filters, can be appropriately used.

As the curable binder component, examples include, but are not limited to, one containing a photocurable binder component that contains a photocurable resin, which is polymerizable and curable by visible light, ultraviolet, electron beam radiation, etc., or one containing a thermosetting binder component that contains a thermosetting resin, which is polymerizable and curable by heating.

Developability is not required of the curable binder component, when color layers can be formed by attaching the color resin composition selectively in a pattern onto a substrate (e.g., the ink-jet method). In this case, a known thermosetting or photosensitive binder component that is used to form the color layers of color filters by the ink-jet method, etc., can be appropriately used.

As the thermosetting binder, a combination of a compound containing two or more thermosetting functional groups per molecule and a curing agent is generally used. In addition, a catalyst that can promote a thermosetting reaction can be added. As the thermosetting functional groups, examples include, but are not limited to, an epoxy group, an oxetanyl group, an isocyanate group and an ethylenically unsaturated bond. As the thermosetting functional groups, epoxy groups are preferably used. As the thermosetting binder component, examples include, but are not limited to, those mentioned in International Publication No. WO2012/144521.

On the other hand, in the case of using a photolithography process to form color layers, a photosensitive binder component with alkali developability is suitably used.

Hereinafter, photosensitive binder components will be explained. However, the curable binder component used in the disclosed embodiments is not limited to them. Besides the below-described photosensitive binder components, a thermosetting binder component that is polymerizable and curable by heating, such as epoxy resin, can be further used.

As the photosensitive binder components, examples include, but are not limited to, a positive photosensitive binder component and a negative photosensitive binder component. As the positive photosensitive binder component, examples include, but are not limited to, those containing an alkali soluble resin and an o-quinonediazide group-containing compound, which is a photosensitivity-imparting component.

On the other hand, as the negative photosensitive binder component, those containing at least an alkali soluble resin, a polyfunctional monomer and a photoinitiator, are suitably used.

In the color resin composition, the negative photosensitive binder component is preferred, from the point of view that a pattern can be easily formed by a photolithography method, using existing processes.

Hereinafter, the alkali soluble resin, the polyfunctional monomer and the photoinitiator, which constitute the negative photosensitive binder component, will be explained in detail.

(1) Alkali Soluble Resin

In the disclosed embodiments, the alkali soluble resin can be appropriately selected, as long as it contains an acidic group, functions as a binder resin, and is soluble in developers used for pattern formation, particularly preferably in an alkaline developer.

In the disclosed embodiments, the alkali soluble resin is preferably a resin containing a carboxyl group as the acidic group. As the resin, examples include, but are not limited to, acrylic copolymers containing a carboxyl group and epoxy (meth)acrylate resins containing a carboxyl group. Of them, particularly preferred is one containing a carboxyl group and, moreover, a photopolymerizable functional group such as an ethylenically unsaturated group in a side chain thereof. This is because the hardness of the cured film thus formed is increased by containing the photopolymerizable functional group. These acrylic copolymers and epoxy (meth) acrylate resins can be used in combination of two or more kinds.

An acrylic copolymer containing a carboxyl group is obtained by copolymerizing a carboxyl group-containing ethylenically unsaturated monomer and an ethylenically unsaturated monomer.

The acrylic copolymer containing a carboxyl group can further contain a constitutional unit containing an aromatic carbon ring. The aromatic carbon ring functions as a component that imparts coatability to the color resin composition.

The acrylic copolymer containing a carboxyl group can further contain a constitutional unit containing an ester group. The constitutional unit containing an ester group not only functions as a component that inhibits the alkali solubility of the color resin composition, but also functions as a component that increases the solubility and re-solubility in solvents.

As the acrylic copolymer containing a carboxyl group, examples include, but are not limited to, those described in International Publication No. WO2012/144521. In particular, examples include, but are not limited to, copolymers obtained from a monomer containing no carboxyl group, such as methyl (meth)acrylate and ethyl (meth)acrylate, with one or more selected from (meth)acrylic acid and anhydrides thereof. Also, examples include, but are not limited to, polymers obtained by introducing an ethylenically unsaturated bond in the above copolymers by, for example, addition of an ethylenically unsaturated compound containing a reactive functional group such as a glycidyl group or hydroxyl group. In the disclosed embodiments, however, the acrylic copolymer containing a carboxyl group is not limited to these examples.

Of these examples, the polymers obtained by introducing an ethylenically unsaturated bond in the above copolymers by, for example, addition of an ethylenically unsaturated compound containing a glycidyl group or hydroxyl group, are particularly preferred from the point of view that polymerization with the below-described polyfunctional monomer is possible upon exposure, and more stable color filters can be obtained.

The copolymerization ratio of the carboxyl group-containing ethylenically unsaturated monomer in the carboxyl group-containing copolymer is generally from 5 to 50% by mass, and preferably from 10 to 40% by mass. When the copolymerization ratio of the carboxyl group-containing ethylenically unsaturated monomer is less than 5% by mass, the solubility of the coating film thus obtained in alkaline developers may be decreased, resulting in a difficulty with pattern formation. When the copolymerization ratio exceeds 50% by mass, upon development with an alkaline developer, a pattern thus formed is likely to come off of the substrate, or the pattern surface is likely to be roughened.

The mass average molecular weight of the carboxyl group-containing copolymer is preferably in a range of from 1,000 to 500,000, and more preferably in a range of from 3,000 to 200,000. When the mass average molecular weight is less than 1,000, there may be a remarkable decrease in binder function after curing. When the mass average molecular weight exceeds 500,000, upon development with an alkaline developer, pattern formation may be difficult.

The mass average molecular weight is obtained by gel permeation chromatography (GPC) as a standard polystyrene equivalent.

The epoxy (meth)acrylate resin containing a carboxyl group is not particularly limited. As the resin, an epoxy (meth)acrylate compound obtained by reaction of an acid anhydride with a reaction product of an epoxy compound and an unsaturated group-containing monocarboxylic acid, is suitable.

The epoxy compound, the unsaturated group-containing monocarboxylic acid and the acid anhydride can be appropriately selected from known ones. As the epoxy compound, the unsaturated group-containing monocarboxylic acid and the acid anhydride, examples include, but are not limited to, those described in International Publication No. WO2012/144521. As each of the epoxy compound, the unsaturated group-containing monocarboxylic acid and the acid anhydride, those mentioned above can be used alone or in combination of two or more kinds.

The alkali soluble resin used in the color resin composition can be one kind of alkali soluble resin or a combination of two or more kinds of alkali soluble resins. The content of the alkali soluble resin is generally in a range of from 10 to 1,000 parts by mass, and preferably in a range of from 20 to 500 parts by mass, with respect to 100 parts by mass of the color material contained in the color resin composition. When the content of the alkali soluble resin is too small, sufficient alkali developability may not be obtained. When the content is too large, the ratio of the color material is relatively small, so that sufficient color density may not be obtained.

(2) Polyfunctional Monomer

The polyfunctional monomer used in the color resin composition is not particularly limited, as long as it is polymerizable with the below-described photoinitiator. As the polyfunctional monomer, a compound containing two or more ethylenically unsaturated double bonds is generally used. The polyfunctional monomer is preferably a polyfunctional (meth)acrylate containing two or more acryloyl or methacryloyl groups.

Such a polyfunctional (meth)acrylate can be appropriately selected from conventionally known ones. As the polyfunctional (meth)acrylate, examples include, but are not limited to, those mentioned in International Publication No. WO2012/144521.

These polyfunctional (meth)acrylates can be used alone or in combination of two or more kinds. When excellent photocurability (high sensitivity) is required of the color resin composition according to the disclosed embodiments, the polyfunctional monomer is preferably one containing three (trifunctional) or more polymerizable double bonds, and preferably poly(meth) acrylates of trivalent or higher polyalcohols and dicarboxylic acid-modified products thereof. More specifically, preferred are trimethylolpropane tri(meth)acrylate, pentaerythritol tri(meth)acrylate, succinic acid-modified products of pentaerythritol tri(meth)acrylate, pentaerythritol tetra(meth)acrylate, dipentaerythritol tetra (meth)acrylate, dipentaerythritol penta(meth)acrylate, succinic acid-modified products of dipentaerythritol penta(meth)acrylate, dipentaerythritol hexa(meth)acrylate, tris(2-acryloyloxyethyl)phosphate and tris(2-methacryloyloxyethyl)phosphate, for example.

The content of the polyfunctional monomer used in the color resin composition is not particularly limited. It is generally from about 5 to 500 parts by mass, and preferably in a range of from 20 to 300 parts by mass, with respect to 100 parts by mass of the alkali soluble resin. When the content of the polyfunctional monomer is smaller than the range, photocuring may not proceed sufficiently and the color resin composition exposed to light may be dissolved. When the content of the polyfunctional monomer is larger than the range, there may be a decrease in alkali developability.

(3) Photoinitiator

The photoinitiator used in the color resin composition is not particularly limited. As the photoinitiator, conventionally-known various kinds of photoinitiators can be used alone or in combination of two or more kinds. As the photoinitiator, examples include, but are not limited to, those mentioned in International Publication No. WO2012/144521.

The content of the photoinitiator used in the color resin composition is generally from about 0.01 to 100 parts by mass, and preferably from 5 to 60 parts by mass, with respect to 100 parts by mass of the polyfunctional monomer. When the content is smaller than the range, sufficient polymerization reaction may not be caused, so that the hardness of the color layer may not be sufficient. When the content is larger than the range, the content of the color material and so on in the solid content of the color resin composition is relatively small, so that sufficient color density may not be obtained.

<Optionally-Added Compounds>

As needed, the color resin composition can further contain other color material or various kinds of additives.

(Other Color Material)

Other color material can be added as needed, for the purpose of color tone control. For example, it can be selected from conventionally-known pigments and dyes, according to the purpose, and such pigments and dyes can be used alone or in combination of two or more kinds.

As the other color material, it is particularly preferable to use the color material described in International Publication No. WO2012/144521, which contains the divalent or higher cation and divalent or higher anion represented by the general formula (I).

As the other color material, examples include, but are not limited to, the color materials described in International Publication Nos. WO2012/39416 and WO2012/39417; pigments such as C.I. Pigment Violet 1, C.I. Pigment Violet 2, C.I. Pigment Violet 3, C.I. Pigment Violet 19, C.I. Pigment Violet 23, C.I. Pigment Blue 1, C.I. Pigment Blue 15, C.I. Pigment Blue 15:3, C.I. Pigment Blue 15:4, C.I. Pigment Blue 15:6, C.I. Pigment Blue 60, C.I. Pigment Red 81 and C.I. Pigment Red 82; and dyes such as Acid Red.

In the case of using the other color material, the content is not particularly limited. Especially in the case of using the color material described in International Publication No. WO2012/144521 as the other color material, which contains the divalent or higher cation and divalent or higher anion represented by the general formula (I), the color material can be preferably used in a desired amount.

The content of the other color material can be determined to an extent that does not impair the effect of the disclosed embodiments. It is preferably 95 parts by mass or less, and more preferably 90 parts by mass or less, with respect to 100 parts by mass (the total amount) of the color material (A).

(Antioxidant)

From the viewpoint of heat resistance and light resistance, it is preferable that the color resin composition further contains an antioxidant. The antioxidant can be appropriately selected from conventionally-known antioxidants. As the antioxidant, examples include, but are not limited to, a hindered phenol-based antioxidant, an amine-based antioxidant, a phosphorus-based antioxidant, a sulfur-based antioxidant and a hydrazine-based antioxidant. From the viewpoint of heat resistance, it is preferable to use a hindered phenol-based antioxidant.

The hindered phenol-based antioxidant means an antioxidant that contains at least one phenol structure in which at least one of the 2- and 6-positions of the hydroxyl group is substituted with a substituent group containing 4 or more carbon atoms.

In the case of using the antioxidant, the amount is not particularly limited, as long as it is in a range that does not impair the effect of the disclosed embodiments. The amount of the antioxidant used is preferably from 0.1 to 5.0% by mass, and more preferably from 0.5 to 4.0% by mass, with respect to the total solid content of the color resin composition. When the amount of the antioxidant used is equal to or more than the lower limit, excellent heat resistance can be obtained. On the other hand, when the amount is equal to or less than the upper limit, the color resin composition can be a highly-sensitive photosensitive resin composition.

(Other Additives)

As the additives, examples include, but are not limited to, the above-mentioned antioxidant, a polymerization inhibitor, a chain transfer agent, a leveling agent, a plasticizer, a surfactant, a defoaming agent, a silane coupling agent, an ultraviolet absorber and an adhesion enhancing agent.

As the surfactant and the plasticizer, examples include, but are not limited to, those mentioned in International Publication No. WO2012/144521.

<The Content of each Component in the Color Resin Composition>]

The total content of the color material (A) is preferably from 3 to 65% by mass, and more preferably from 4 to 55% by mass, with respect to the total solid content of the color resin composition. When the total content is equal to or more than the lower limit, the color layer obtained by applying the color resin composition for a color filter to a predetermined thickness (generally from 1.0 to 5.0 μm) can obtains sufficient color density. When the total content is equal to or less than the upper limit, excellent dispersibility and dispersion stability can be obtained, and a color layer with sufficient hardness and adhesion to the substrate can be obtained. In the disclosed embodiments, "solid content" includes all the above-described components other than the solvent, and it also includes the polyfunctional monomer in a liquid form.

Also, the content of the dispersant (B) is not particularly limited, as long as the color material (A) can be homogeneously dispersed. For example, the dispersant content is preferably from 3 to 70 parts by mass, with respect to the total solid content of the color resin composition. Also, the content is more preferably from 5 to 60 parts by mass, and particularly preferably from 5 to 50 parts by mass, with respect to the total solid content of the color resin composition. When the content is equal to or more than the lower limit, the color material (A) can obtain excellent dispersibility and dispersion stability, and it can obtain excellent storage stability. When the content is equal to or less than the upper limit, excellent developability can be obtained.

The total amount of the binder component (D) is preferably from 10 to 92% by mass, and more preferably from 15 to 87% by mass, with respect to the total solid content of the color resin composition. When the total amount is equal to or more than the lower limit, a color layer with sufficient hardness and adhesion to the substrate can be obtained. When the total amount is equal to or less than the upper limit, excellent developability can be obtained, and generation of fine wrinkles, which is due to heat shrinkage, can be inhibited.

The content of the solvent (C) can be appropriately determined in a range that can form a color layer with accuracy. In general, the content is preferably in a range of from 55 to 95% by mass, and particularly preferably in a range of from 65 to 88% by mass, with respect to the total amount of the color resin composition including the solvent. When the content of the solvent is in the range, excellent coatability can be provided to the color resin composition.

<Method for Producing the Color Resin Composition>

The method for producing the color resin composition is not particularly limited, as long as it is a method in which the color material (A), the dispersant (B), the solvent (C), the binder component (D) and various kinds of additional components that are added as needed are contained, and the color material (A) can be homogeneously dispersed in the solvent (C) by the dispersant (B). The color resin composition can be prepared by mixing them using a known mixing means.

As the method for preparing the color resin composition, examples include, but are not limited to, (1) a method of mixing the color material dispersion liquid according to the disclosed embodiments with the binder component (D) and various kinds of additional components used as needed; (2) a method of adding the color material (A), the dispersant (B), the binder component (D) and various kinds of additional components used as needed to the solvent (C) at the same time and mixing them; and (3) a method of adding the dispersant (B), the binder component (D) and various kinds of additional components used as needed to the solvent (C), mixing them, adding the color material (A) thereto and then mixing them.

Of these methods, the method (1) is preferred, from the viewpoint of effectively inhibiting the color material from aggregation and homogeneously dispersing the color material.

The color resin composition according to the disclosed embodiments can be suitably used for not only color filter application but also printing application, color toner application, and coating application. When the rhodamine-based acid dye is a UV absorbing dye, the color resin composition according to the disclosed embodiments can be suitably used as a UV absorbing material. When the rhodamine-based acid dye is an infrared absorbing dye, the color resin composition according to the disclosed embodiments can be suitably used as an infrared absorbing material. When the rhodamine-based acid dye is a food dye or tar dye, the color resin composition according to the disclosed embodiments can be suitably used in cosmetics, foods, drugs and medicines, etc.

3. Color Filter

In another embodiment, there is provided a color filter comprising at least a transparent substrate and color layers disposed on the substrate, wherein at least one of the color layers contains a lake color material of a combination of an acid dye and a polyaluminum chloride; a basicity of the polyaluminum chloride is 70% or more; and a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50.

In another embodiment, there is provided a color filter comprising at least a transparent substrate and color layers disposed on the substrate, wherein at least one of the color layers contains a lake color material of a combination of an acid dye and a polyaluminum chloride; a value of a ratio ($I_4/I_6$) between an integral value ($I_4$) of a peak corresponding to a four-coordinate aluminum in a solid-state 27Al-NMR spectrum of the lake color material and an integral value ($I_6$) of a peak corresponding to a six-coordinate aluminum therein, is from 0 to 0.50; and a peak width at a spectral intensity of 0 of the peak corresponding to the six-coordinate aluminum, is 13 ppm or less.

The color filter production method according to the disclosed embodiments is a method for producing a color filter comprising at least a transparent substrate and color layers disposed on the substrate, the method comprising a step of forming at least one of the color layers on the transparent substrate by curing the color resin composition according to the disclosed embodiments.

Such a color filter of the disclosed embodiments will be explained with reference to figures. FIG. 1 is a schematic sectional view of an example of the color filter according to the disclosed embodiments. According to FIG. 1, a color filter 10, which is the color filter according to the disclosed embodiments, includes a transparent substrate 1, a light shielding part 2 and a color layer 3.

(Color Layer)

At least one of the color layers used in the color filter according to the disclosed embodiments, is a color layer that contains the specific polyaluminum chloride lake color material of the acid dye.

Determination of whether a color layer contains the specific polyaluminum chloride lake color material of the acid dye, can be carried out by obtaining an extract from the color layer using dimethyl sulfoxide (DMSO), refining the extract as needed, and measuring the solid-state $^{27}$Al-NMR spectrum of the extract.

The color layers are generally formed on openings of the light shielding part on the below-described transparent substrate and composed of color patterns in three or more colors.

The arrangement of the color layers is not particularly limited and can be a general arrangement such as a stripe type, a mosaic type, a triangle type or a four-pixel arrangement type. The width, area, etc., of the color layer can be determined appropriately.

The thickness of the color layers is appropriately controlled by controlling the applying method or the solid content concentration, viscosity, etc., of the color resin composition. In general, the thickness is preferably in a range of from 1 to 5 μm.

For example, when the color resin composition is a photosensitive resin composition, the color layer can be formed by the following method. It is preferable that the color layer containing the specific polyaluminum chloride lake color material of the acid dye, which is used in the color filter according to the disclosed embodiments, is formed using the above-described color resin composition which contains the color material (A), the dispersant (B), the solvent (C) and the binder component (D) and in which the color material (A) contains the specific polyaluminum chloride lake color material of the acid dye. It is also preferable that the color layer containing the specific polyaluminum chloride lake color material of the acid dye, is a cured product of the above-described color resin composition.

First, the color resin composition is applied onto the below-described transparent substrate by a coating method such as a spray coating method, a dip coating method, a bar coating method, a roll coating method, a spin coating method, a slit coating method or a die coating method to form a wet coating film.

Then, the wet coating film is dried with a hot plate, an oven, etc. The dried film is subjected to exposure through a mask with a given pattern to cause a photopolymerization reaction of the alkali soluble resin, the polyfunctional monomer, etc., thereby obtaining a photosensitive coating film. A light source is used for the exposure. As the light source, examples include, but are not limited to, a low pressure mercury lamp, a high pressure mercury lamp and a metal halide lamp, and ultraviolet rays and electron beams. The exposure amount is appropriately controlled, depending on the used light source and the thickness of the coating film.

The film can be heated to promote a polymerization reaction after the exposure. The heating condition is appropriately determined, depending on the content ratio of the components used in the color resin composition, the thickness of the coating film, etc.

Next, the thus-obtained film is developed with a developer to dissolve and remove unexposed portions, thereby forming a coating film in a desired pattern. As the developer, a solution obtained by dissolving alkali in water or aqueous solvent, is generally used. An appropriate amount of surfactant, etc., can be added to the alkali solution. The developing method can be selected from general developing methods.

After the developing treatment, generally, the developer is rinsed off, followed by drying of the cured coating film of the color resin composition, thereby forming a color layer. To sufficiently cure the coating film, a heating treatment can be carried out after the developing treatment. The heating condition is not particularly limited and is appropriately determined depending on the intended application of the coating film.

(Light Shielding Part)

In the color filter according to the disclosed embodiments, the light shielding part is formed in pattern on the below-described transparent substrate, and it can be the same as those used in general color filters.

The pattern shape of the light shielding part is not particularly limited. As the pattern shape, examples include, but are not limited to, a stripe-shaped pattern and a matrix-shaped pattern. As the light shielding part, examples include, but are not limited to, one produced by dispersing or dissolving a black pigment in a binder resin, and thin metal layers of chromium, chromium oxide, etc. When the light shielding part is such a thin metal layer, the layer can be a stack of two layers of one $CrO_x$ layer (x is an arbitrary number) and one Cr layer, or it can be a stack of three layers of one $CrO_x$ layer (x is an arbitrary number), one $CrN_y$ layer (y is an arbitrary number) and one Cr layer, the stack of the three layers having a further reduced reflectance.

When the light shielding part is one produced by dispersing or dissolving a black color material in a binder resin, the method for producing the light shielding part is not particularly limited, as long as it is a method that can pattern the light shielding part. As the method, examples include, but are not limited to, a photolithography method using a color resin composition for the light shielding part, a printing method using the same, and an ink-jet method using the same.

When the light shielding part is a thin metal layer, the thickness is from about 0.2 to 0.4 µm. When the light shielding part is formed from the black color material dispersed or dissolved in the binder resin, the thickness is from about 0.5 to 2 µm.

(Transparent Substrate)

The transparent substrate of the color filter according to the disclosed embodiments, is not particularly limited, as long as it is a substrate that is transparent to visible light. It can be selected from general transparent substrates used in color filters. As the transparent substrate, examples include, but are not limited to, inflexible transparent rigid materials such as silica glass plate, non-alkali glass plate and synthetic silica plate, and transparent flexible materials with flexibility and flexible properties, such as transparent resin film, optical resin plate and flexible glass.

The thickness of the transparent substrate is not particularly limited. Depending on the intended application of the color filter of the disclosed embodiments, one with a thickness of from about 50 µm to 1 mm can be used, for example.

In addition to the transparent substrate, the light shielding part and the color layer, the color filter according to the disclosed embodiments can also include an overcoat layer and a transparent electrode layer, for example. Moreover, the color filter according to the disclosed embodiments can include an orientation film for orienting a liquid crystal material, a columnar spacer, etc. The color filter according to the disclosed embodiments is not limited to the above-exemplified structure. A known structure that is generally used for a color filter can be appropriately selected.

4. Liquid Crystal Display Device

The liquid crystal display device according to the disclosed embodiments comprises the above-described color filter according to the disclosed embodiments, a counter substrate, and a liquid crystal layer disposed between the color filter and the counter substrate.

Figure 2:
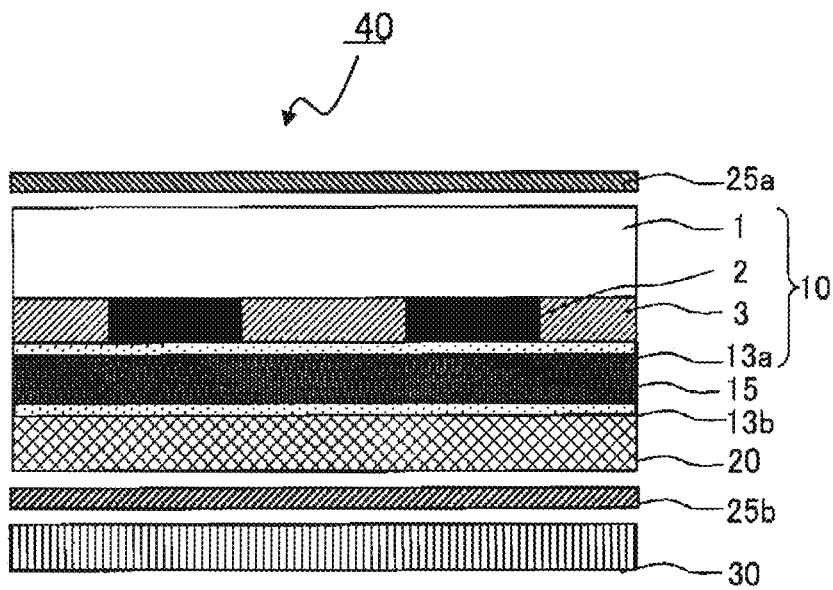
FIG. 2 is a schematic sectional view of an example of the liquid crystal display device according to the disclosed embodiments.

Such a liquid crystal display device according to the disclosed embodiments will be explained with reference to a figure. FIG. 2 is a schematic view of an example of the liquid crystal display device according to the disclosed embodiments. As shown in FIG. 2, a liquid crystal display device 40, which is the liquid crystal display device according to the disclosed embodiments, includes a color filter 10, a counter substrate 20 including a TFT array substrate, etc., and a liquid crystal layer 15 formed between the color filter 10 and the counter substrate 20. Such an example is shown in FIG. 2, that an example an orientation layer 13a is formed on a color layer 3 side of the color filter 10; an orientation layer 13b is formed on a counter substrate 20 side of the same; and the liquid crystal layer 15 is formed between the two orientation films 13a and 13b. In addition, such an example is shown in FIG. 2, that the liquid crystal display device 40 includes a polarization plate 25a disposed outside the color filter 10, a polarization plate 25b disposed outside the counter substrate 20, and a backlight 30 disposed on the outer side than the polarization plate 25b disposed on the counter substrate 20 side of the liquid crystal display device 40.

The liquid crystal display device according to the disclosed embodiments is not limited to the configuration shown in FIG. 2. It can be a configuration that is generally known as a liquid crystal display device including a color filter.

The method for driving the liquid crystal display device according to the disclosed embodiments is not particularly limited. It can be selected from driving methods that are generally used in liquid crystal display devices. As such driving methods, examples include, but are not limited to, a TN method, an IPS method, an OCB method and an MVA method. In the disclosed embodiments, any of these methods can be suitably used.

The counter substrate can be appropriately selected, depending on the driving method, etc., of the liquid crystal display device according to the disclosed embodiments.

Also, the liquid crystal constituting the liquid crystal layer can be selected from various liquid crystals with varying dielectric anisotropies and mixtures thereof, depending on the driving method, etc., of the liquid crystal display device according to the disclosed embodiments.

The method for forming the liquid crystal layer can be selected from methods that are generally used to produce liquid crystal cells. As the method, examples include, but are not limited to, a vacuum injection method and a liquid crystal dripping method.

In the vacuum injection method, for example, a liquid crystal cell is produced in advance, using a color filter and a counter substrate; liquid crystal is heated to become isotropic liquid; the liquid crystal is injected into the liquid crystal cell, while it is in the form of isotropic liquid, using the capillary effect; and the liquid crystal cell is encapsulated with an adhesive agent, thereby forming a liquid crystal layer. Then, the encapsulated liquid crystal can be oriented by gradually cooling the liquid crystal cell to room temperature.

In the dripping method, for example, a sealing agent is applied to the periphery of a color filter; the color filter is heated to the temperature at which the liquid crystal enters an isotropic phase; the liquid crystal is dripped with a dispenser or the like, while it is in the form of isotropic liquid; and the color filter and the counter substrate are stacked under reduced pressure and attached to each other via the applied sealing agent, thereby forming a liquid crystal layer. Then, the encapsulated liquid crystal can be oriented by gradually cooling the liquid crystal cell to room temperature.

The backlight used in the liquid crystal display device according to the disclosed embodiments, can be appropriately selected depending on the intended application of the liquid crystal display device. As the backlight, examples include, but are not limited to, a backlight unit using a cold cathode fluorescent lamp (CCFL), a white LED or a white organic EL as a light source.

As the white LED, examples include, but are not limited to, a white LED that obtains white light by color mixing of a red LED, a green LED and a blue LED; a white LED that obtains white light by color mixing of a blue LED, a red LED and a green phosphor; a white LED that obtains white light by color mixing of a blue LED, a red-emitting phosphor and a green-emitting phosphor; a white LED that obtains white light by color mixing of a blue LED and a YAG phosphor; and a white LED that obtains white light by color mixing of a UV LED, a red-emitting phosphor, a green-emitting phosphor and a blue-emitting phosphor. As the phosphors, quantum dots can be used.

The color filter according to the disclosed embodiments includes a high-luminance blue color layer, that is, a blue color layer with high transmittance. Therefore, the color filter can be also suitably used in combination with a backlight that is, compared to a blue LED-YAG phosphor backlight, high in green and red light intensity and relatively low in blue light intensity, such as a white LED that obtains white light by color mixing of red, green and blue colors.

5. Light-Emitting Display Device

The light-emitting display device according to the disclosed embodiments comprises the above-described color filter according to the disclosed embodiments and a light-emitting body. As the light-emitting display device according to the disclosed embodiments, examples include, but are not limited to, an organic light-emitting display device comprising an organic light-emitting body as the light-emitting body. The light-emitting body is not limited to the organic light-emitting body, and an inorganic light-emitting body can be appropriately used.

Figure 3:
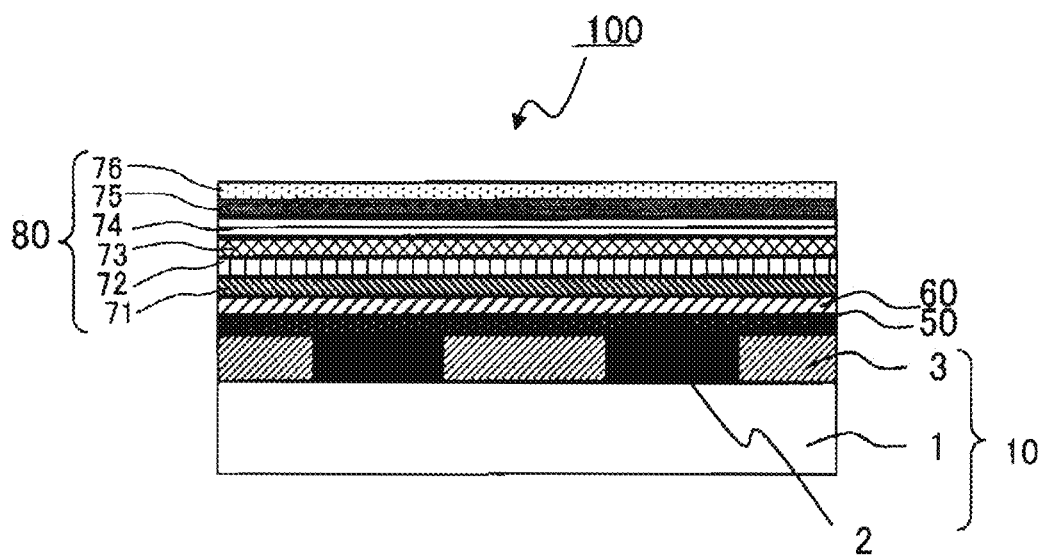
FIG. 3 is a schematic sectional view of an example of the light-emitting display device according to the disclosed embodiments.

Such a light-emitting display device of the disclosed embodiments will be explained with reference to a figure. FIG. 3 is a schematic view of an example of the light-emitting display device according to the disclosed embodiments. As shown in FIG. 3, a light-emitting display device 100, which is the light-emitting display device according to the disclosed embodiments, includes a color filter 10 and a light-emitting body 80. An organic protection layer 50 and/or an inorganic oxide layer 60 can be disposed between the color filter 10 and the light-emitting body 80.

As the method for stacking the components of the light-emitting body 80, examples include, but are not limited to, a method of stacking a transparent positive electrode 71, a positive hole injection layer 72, a positive hole transport layer 73, a light-emitting layer 74, an electron injection layer 75 and a negative electrode 76 in this sequence on the color filter, and a method of attaching the light-emitting body 80 formed on a different substrate onto the inorganic oxide layer 60. The transparent positive electrode 71, the positive hole injection layer 72, the positive hole transport layer 73, the light-emitting layer 74, the electron injection layer 75, the negative electrode 76 and other components of the light-emitting body 80 can be appropriately selected from conventionally-known materials. The light-emitting display device 100 produced as mentioned above is applicable to both passive and active drive organic EL displays, for example.

The light-emitting display device according to the disclosed embodiments is not limited to a light-emitting display device of the configuration shown in FIG. 3. It can include any one of configurations that are generally known as those of light-emitting display devices using a color filter.

EXAMPLES

Hereinafter, the disclosed embodiments will be described in detail, by way of examples. The disclosed embodiments are not limited by these examples.

Synthesis Example 1: Synthesis of Rhodamine-Based Color Material A

First, 10.0 g of Acid Red 289 (AR289, manufactured by Tokyo Chemical Industry Co., Ltd., a rhodamine-based acid dye represented by the following chemical formula (1)) was added to 490 ml of water and dissolved at 80° C. for 1 hour to prepare a dye solution. Then, 8.66 g of a polyaluminum chloride (product name: Takibine #1500, manufactured by: Taki Chemical Co., Ltd., $Al_2(OH)_5Cl$, basicity 83.0% by mass, alumina content 23.2% by mass) was added to 200 ml of water and diluted at 25° C. to prepare a polyaluminum chloride aqueous solution. Dropwise addition of the polyaluminum chloride aqueous solution was started within 5 minutes after the dilution, and the polyaluminum chloride aqueous solution was added to the dye solution at 80° C. in a dropwise manner for 15 minutes. The resulting mixture was stirred at 80° C. for 2 hours. A precipitate thus produced was obtained by filtration and washed with water. A cake thus obtained was dried, thereby obtaining 13.29 g of a rhodamine-based color material A.

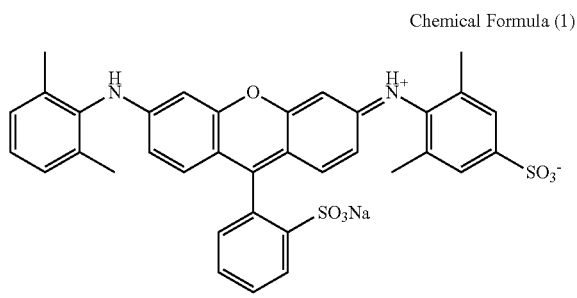

Chemical Formula (1)

Synthesis Examples 2 to 12 and Comparative Synthesis Examples 1, 4 and 5

Rhodamine-based color materials B to G, I, K and L, an anthraquinone-based color material A, a phthalocyanine-based color material A, a triarylmethane-based color material A, a disazo-based color material A and a monoazo-based color material A of Synthesis Examples 2 to 12 and Comparative Synthesis Examples 1, 4 and 5, were obtained in the same manner as Synthesis Example 1, except that the acid dye serving as anion, the type and amount of the laking agent used, and the time taken from the dilution of the laking agent to the use, were changed as shown in Table 1.

Comparative Synthesis Example 2: Synthesis of Rhodamine-Based Color Material H First, 10.0 g of Acid Red 289 (manufactured by Tokyo Chemical Industry Co., Ltd.) was added to 490 ml of water and dissolved at 80° C. for 1 hour to prepare a dye solution. Then, 8.66 g of a polyaluminum chloride (product name: Takibine #1500, manufactured by: Taki Chemical Co., Ltd., $Al_2(OH)_5Cl$, basicity 83.0% by mass, alumina content 23.2% by mass) was added to 200 ml of water, and the mixture was stirred at 80° C. for 1 hour to prepare a polyaluminum chloride aqueous solution. The polyaluminum chloride aqueous solution was cooled to 25° C. and then added in a dropwise manner to the dye solution at 80° C. for 15 minutes. The mixture was stirred at 80° C. for 2 hours. A precipitate thus produced was obtained by filtration and washed with water. A cake thus obtained was dried, thereby obtaining 13.30 g of a rhodamine-based color material H.

Comparative Synthesis Examples 3 and 6 to 10

A rhodamine-based color material J, an anthraquinone-based color material B, a phthalocyanine-based color material B, a triarylmethane-based color material B, a disazo-based color material B and a monoazo-based color material B of Comparative Synthesis Examples 3 and 6 to 10, were obtained in the same manner as Comparative Synthesis Example 2, except that the acid dye serving as anion, and the type and amount of the laking agent used, were changed as shown in Table 1.

TABLE 1

| Production Example | Color Material | Acid dye | Amount used (g) | Laking agent | Basicity (%) | Amount used (g) | Laking agent preparing condition | Ratio of integral values of peaks ($I_4/I_6$) | Peak width (ppm) |
|---|---|---|---|---|---|---|---|---|---|
| Synthesis Example 1 | Rhodamine-based color material A | AR289 | 10.00 | Takibine #1500 | 83.0 | 8.66 | 25° C. 5 min | 0.17 | 8.5 |
| Synthesis Example 2 | Rhodamine-based color material B | AR289 | 10.00 | Takibine #1500 | 83.0 | 8.66 | 25° C. 1 h | 0.18 | 8.2 |
| Synthesis Example 3 | Rhodamine-based color material C | AR289 | 10.00 | Takibine #1500 | 83.0 | 8.66 | 25° C. 3 h | 0.20 | 8.1 |
| Synthesis Example 4 | Rhodamine-based color material D | AR289 | 10.00 | Takibine #1500 | 83.0 | 8.66 | 25° C. 6 h | 0.24 | 7.8 |
| Synthesis Example 5 | Rhodamine-based color material E | AR289 | 10.00 | Takibine #1500 | 83.0 | 8.66 | 25° C. 12 h | 0.40 | 8.3 |
| Synthesis Example 6 | Rhodamine-based color material F | AR289 | 10.00 | Takibine #1500 | 83.0 | 8.66 | 25° C. 24 h | 0.45 | 7.7 |
| Comparative Synthesis Example 1 | Rhodamine-based color material G | AR289 | 10.00 | Takibine #1500 | 83.0 | 8.66 | 25° C. 48 h | 0.63 | 11 |
| Comparative Synthesis Example 2 | Rhodamine-based color material H | AR289 | 10.00 | Takibine #1500 | 83.0 | 8.66 | 80° C. 1 h | 0.89 | 9.3 |
| Synthesis Example 7 | Rhodamine-based color material I | AR289 | 10.00 | TAN WHITE | 74.5 | 8.73 | 25° C. 5 min | 0.45 | 7.9 |
| Comparative Synthesis Example 3 | Rhodamine-based color material J | AR289 | 10.00 | TAN WHITE | 74.5 | 8.73 | 80° C. 1 h | 1.29 | 6.9 |
| Comparative Synthesis Example 4 | Rhodamine-based color material K | AR289 | 10.00 | Polyaluminum chloride with fair average quality | 53.9 | 38.00 | 25° C. 5 min | 0.08 | 14.2 |

TABLE 1-continued

| Production Example | Color Material | Acid dye | Acid dye Amount used (g) | Laking agent | Laking agent Basicity (%) | Laking agent Amount used (g) | Laking agent preparing condition | Ratio of integral values of peaks ($I_4/I_6$) | Peak width (ppm) |
|---|---|---|---|---|---|---|---|---|---|
| Comparative Synthesis Example 5 | Rhodamine-based color material L | AR289 | 10.00 | Aluminum nitrate | — | 2.59 | 25° C. 5 min | — | — |
| Synthesis Example 8 | Anthraquinone-based color material A | AB80 | 10.00 | Takibine #1500 | 83.0 | 6.99 | 25° C. 5 min | <0.1 | 8.2 |
| Comparative Synthesis Example 6 | Anthraquinone-based color material B | AB80 | 10.00 | Takibine #1500 | 83.0 | 6.99 | 80° C. 1 h | 0.55 | 8.6 |
| Synthesis Example 9 | Phthalocyanine-based color material A | DB86 | 10.00 | Takibine #1500 | 83.0 | 8.84 | 25° C. 5 min | <0.1 | 9.7 |
| Comparative Synthesis Example 7 | Phthalocyanine-based color material B | DB86 | 10.00 | Takibine #1500 | 83.0 | 8.84 | 80° C. 1 h | 0.51 | 8.8 |
| Synthesis Example 10 | Triarylmethane-based color material A | AB90 | 10.00 | Takibine #1500 | 83.0 | 2.52 | 25° C. 5 min | <0.1 | 7.7 |
| Comparative Synthesis Example 8 | Triarylmethane-based color material B | AB90 | 10.00 | Takibine #1500 | 83.0 | 2.52 | 80° C. 1 h | 0.69 | 9 |
| Synthesis Example 11 | Disazo-based color material A | AY79 | 10.00 | Takibine #1500 | 83.0 | 4.27 | 25° C. 5 min | <0.1 | 7.9 |
| Comparative Synthesis Example 9 | Disazo-based color material B | AY79 | 10.00 | Takibine #1500 | 83.0 | 4.27 | 80° C. 1 h | 0.66 | 9 |
| Synthesis Example 12 | Monoazo-based color material A | AR183 | 10.00 | Takibine #1500 | 83.0 | 3.24 | 25° C. 5 min | <0.1 | 10.5 |
| Comparative Synthesis Example 10 | Monoazo-based color material B | AR183 | 10.00 | Takibine #1500 | 83.0 | 3.24 | 80° C. 1 h | 0.52 | 11.1 |

The details of the acid dyes and laking agents shown in Table 1 are as follows.

"Takibine #1500" (product name, manufactured by: Taki Chemical Co., Ltd., basicity: 83.0% by mass, alumina content: 23.2% by mass, chemical formula in MSDS: $Al_2(OH)_5Cl$)

"TAN WHITE" (product name, manufactured by: Taki Chemical Co., Ltd., basicity: 74.5% by mass, alumina content: 23% by mass, chemical formula in MSDS: $Al_4(OH)_9Cl_3$)

Polyaluminum chloride with fair average quality (manufactured by: Tosoh Corporation, basicity: 53.9% by mass, alumina content: 10.2% by mass, chemical formula in MSDS: $[Al_2(OH)_nCl_{(6-n)}]_m$ (where n is from 1 to 5, and m is 10 or less))

Aluminum nitrate nonahydrate (manufactured by: Wako Pure Chemical Industries, Ltd.)

AB 80: Acid Blue 80, manufactured by Aldrich, anthraquinone-based acid dye represented by the following chemical formula (2):

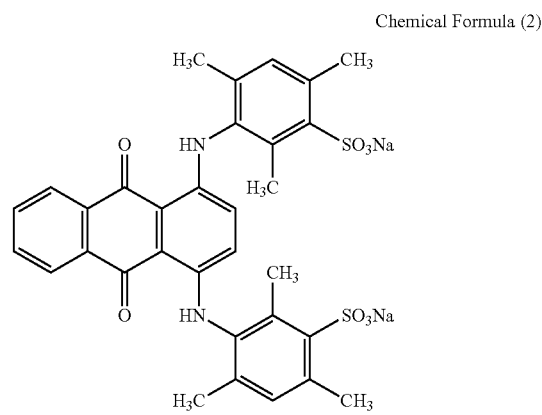

Chemical Formula (2)

DB 86: Direct Blue 86, manufactured by Tokyo Chemical Industry Co., Ltd., phthalocyanine-based acid dye represented by the following chemical formula (3):

Chemical Formula (3)

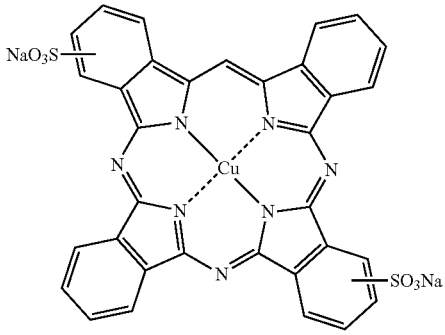

AB 90: Acid Blue 90, manufactured by Tokyo Chemical Industry Co., Ltd., triarylmethane-based acid dye represented by the following chemical formula (4):

Chemical Formula (4)

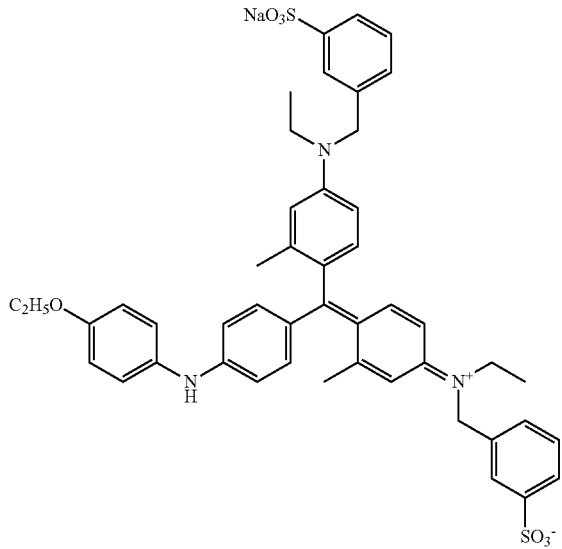

AY79: Acid Yellow 79, manufactured by Chugai kasei Co., Ltd. (product name: Chuganol Milling Yellow 4G), disazo-based dye represented by the following chemical formula (5):

Chemical Formula (5)

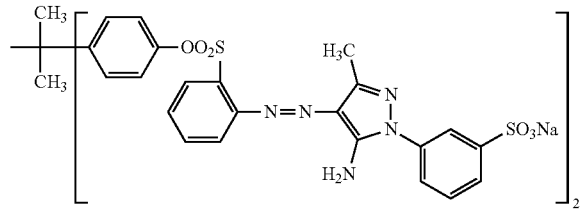

AR183: Acid Red 183, manufactured by Aldrich, monoazo-based dye represented by the following chemical formula (6):

Chemical Formula (6)

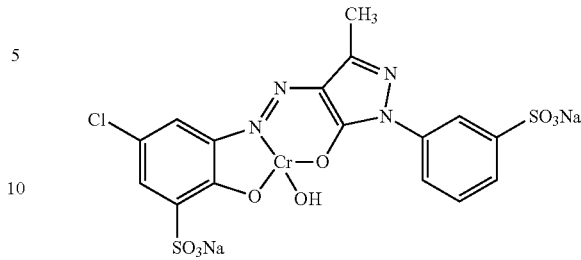

<Solid-State $^{27}$Al-NMR Measurement>

The lake color materials of Synthesis Examples 1 to 12 and Comparative Synthesis Examples 1 to 10, were measured by solid-state $^{27}$Al-NMR spectroscopy in the following measurement condition. For each lake color material, from the thus-obtained solid-state $^{27}$Al-NMR spectrum, the value of the ratio ($I_4/I_6$) between the integral value ($I_4$) of a peak corresponding to a four-coordinate aluminum (from 50 ppm to 80 ppm) and the integral value ($I_6$) of a peak corresponding to a six-coordinate aluminum (from 0 ppm to 25 ppm) was obtained. The value of the ratio ($I_4/I_6$) is shown in Table 1.

Also, the peak width at a spectral intensity of 0 of the peak corresponding to the six-coordinate aluminum, was obtained by, as shown in FIG. 10, measuring the peak width at a spectral intensity of 0 of such a peak that the peak top of the chemical shift was in a range of from 0 to 25 ppm. The peak width is also shown in Table 1.

(Measurement Condition and Analysis Condition)
Device: AVANCE III HD (manufactured by BRUKER)
Resolving power: 400 MHz
Nuclide: $^{27}$Al
Probe: PH MASVTN400SB BL4N
NMR tube: 4 mm zirconia rotor
Measurement method: DD (dipolar decoupling)/MAS (magic angle spinning) method
Number of data points: 2048
Spectral width: 30242 Hz
$^{27}$Al resonance frequency: 104.30 MHz
$^{27}$Al 90° pulse width: 3.5 μsec
MAS rotation frequency: 10000 Hz
Repetition interval: 15 sec
Measurement temperature: Room temperature
Chemical shift standard: Aluminum nitrate nonahydrate was defined to be at 0 ppm
Accumulated number of times: 1024
Window function: Trapezoid
Left trapezoid limit (TM1): 0.05
Right trapezoid limit (TM2): 0.05

Figure 8:
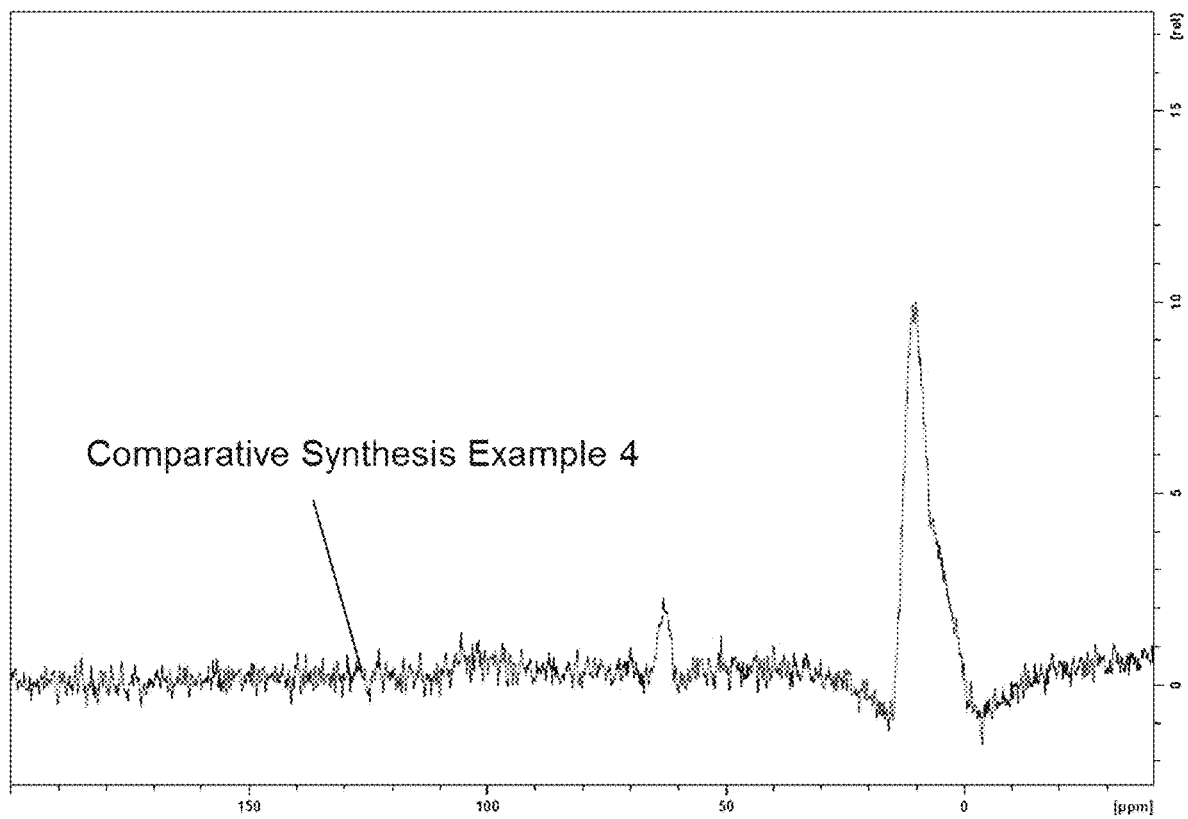
FIG. 8 shows a solid-state $^{27}$Al-NMR spectrum of a color material of Comparative Synthesis Example 4 (in which a polyaluminum chloride with fair average quality was used as a laking agent)
Figure 9:
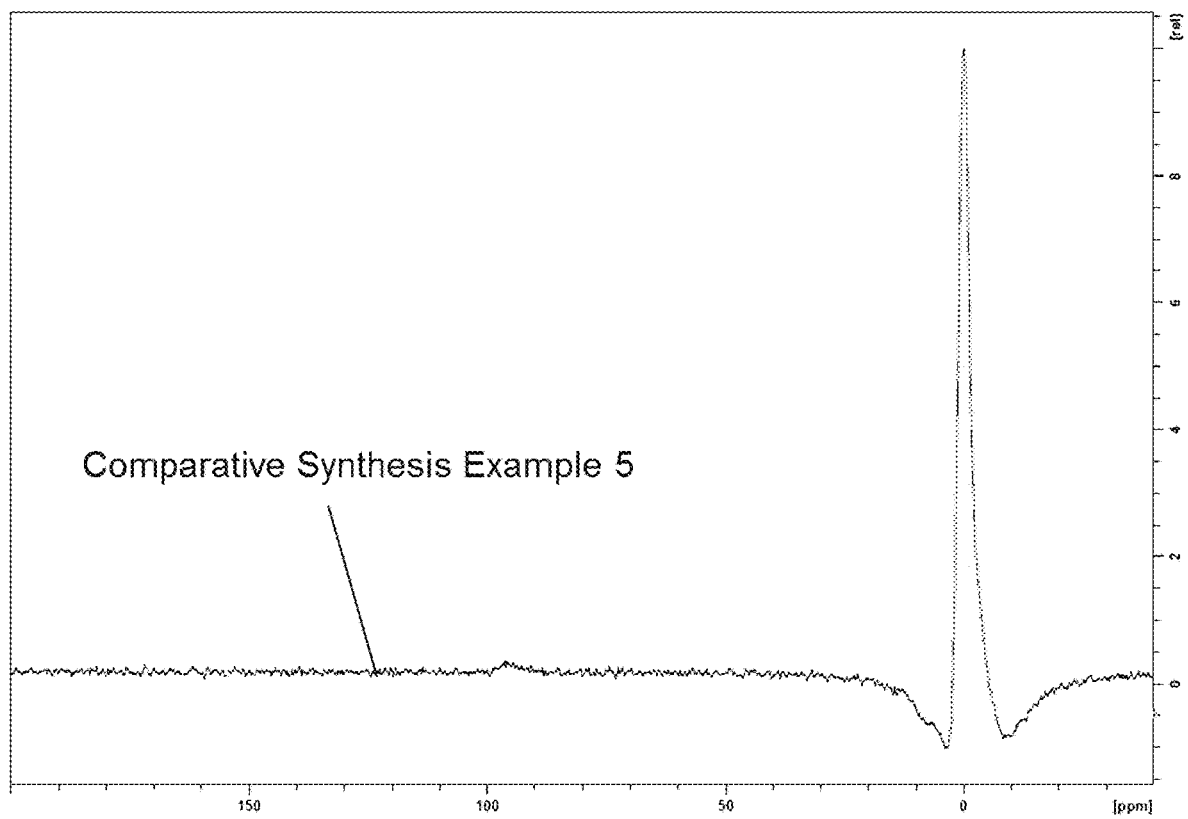
FIG. 9 shows a solid-state $^{27}$Al-NMR spectrum of a color material of Comparative Synthesis Example 5 (in which an aluminum nitrate was used as a laking agent)

FIG. 7 shows a solid-state $^{27}$Al-NMR spectrum of the color material of Synthesis Example 1, a solid-state $^{27}$Al-NMR spectrum of the color material of Synthesis Example 3, a solid-state $^{27}$Al-NMR spectrum of the color material of Comparative Synthesis Example 1, and a solid-state $^{27}$Al-NMR spectrum of the color material of Comparative Synthesis Example 2. FIG. 8 shows a solid-state $^{27}$Al-NMR spectrum of the color material of Comparative Synthesis Example 4 (in which a polyaluminum chloride with fair average quality was used as a laking agent). FIG. 9 shows a solid-state $^{27}$Al-NMR spectrum of the color material of Comparative Synthesis Example 5 (in which an aluminum nitrate was used as a laking agent).

Comparative Synthesis Example 11: Synthesis of Rhodamine-Based Color Material M

First, 5.00 g of Basic Red 1 represented by the following chemical formula (7) (a rhodamine-based basic dye manufactured by Tokyo Chemical Industry Co., Ltd.) was added to 500 ml of water and dissolved at 90° C. to prepare a dye solution. Then, 11.90 g of phosphotungstic acid n-hydrate $H_3[PW_{12}O_{40}]\cdot nH_2O$ (manufactured by Nippon Inorganic Colour & Chemical Co., Ltd., n=30) was added to 200 ml of water, and the mixture was stirred at 90° C. to prepare a phosphotungstic acid aqueous solution. The aqueous solution was added to the dye solution in a dropwise manner for 15 minutes at 90° C., and the mixture was stirred at 90° C. for 1 hour. A precipitate thus produced was obtained by filtration and washed with water. A cake thus obtained was dried, thereby obtaining 13.45 g of a rhodamine-based color material M (a phosphotungstic acid lake color material of the rhodamine-based basic dye).

Chemical Formula (7)

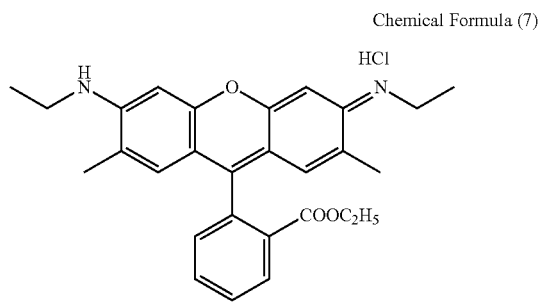

Comparative Synthesis Example 12: Synthesis of Rhodamine-Based Color Material N

First, 5.0 g of Acid Red 289 (manufactured by Tokyo Chemical Industry Co., Ltd., a rhodamine-based acid dye) was added to 500 ml of water and dissolved at 80° C. to prepare a dye solution. Then, 4.99 g of Arquad 2HP Flake (product name, manufactured by LION AKZO Co., Ltd., dimethyl distearyl ammonium chloride, effective solid content 95.5%) was added to 85 g of isopropyl alcohol and dissolved to prepare a dimethyl distearyl ammonium chloride solution. The dye solution was cooled to 5° C. in an ice bath. The dimethyl distearyl ammonium chloride solution thus prepared was added to the dye solution in a dropwise manner at 5° C. for 25 minutes, and the mixture was stirred at 5° C. for 1 hour. A precipitate thus produced was obtained by filtration and washed with water. A cake thus obtained was dried, thereby obtaining 9.07 g of a rhodamine-based color material N (a quaternary ammonium salt-forming compound of the rhodamine-based acid dye).

Preparation Example 1: Synthesis of Blue Lake Color Material α

(1) Synthesis of Intermediate 1

With reference to the method for producing intermediates and 4 described in International Publication No. WO2012/144521, 15.9 g of an intermediate 1 represented by the following chemical formula (8) was obtained (yield 70%).

The compound thus obtained was confirmed to be a target compound from the following analysis results:

MS(ESI) (m/z): 511(+), divalent

Elemental analysis values: CHN measurement values (78.13%, 7.48%, 7.78%); theoretical values (78.06%, 7.75%, 7.69%)

Chemical Formula (8)

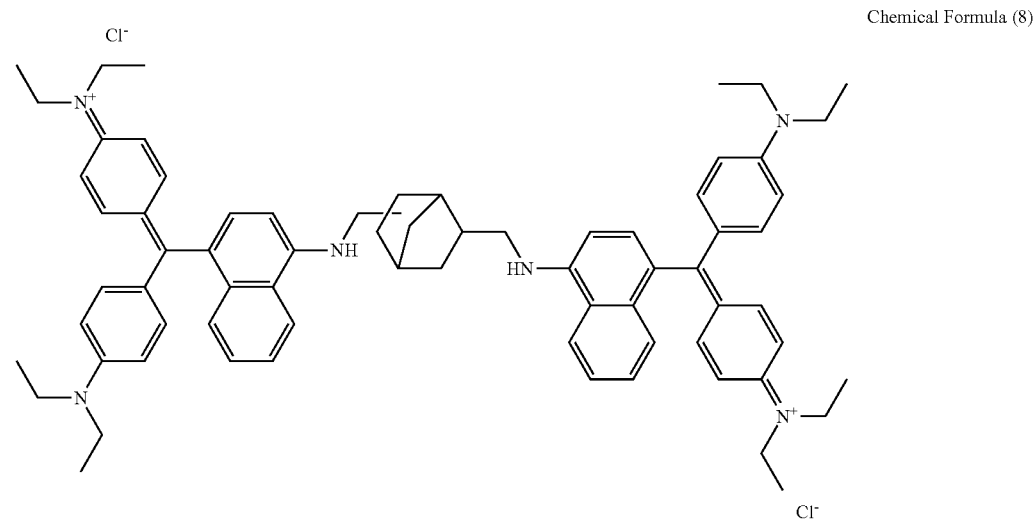 [SMILES: [Cl-] ; CCNc1ccc(C(=C2C=CC(=[N+](CC)CC)C=C2)c2ccc(N(CC)CC)cc2)c2ccccc12 ; CCN(CC)c1ccc(C(=C2C=CC(=[N+](CC)CC)C=C2)c2ccc(NCC3CC4CCC3C4)c3ccccc23)cc1 ; [Cl-]]

(2) Synthesis of Blue Lake Color Material α

First, 5.00 g (4.58 mmol) of the intermediate 1 was added to 300 ml of water and dissolved at 90° C. to prepare an intermediate 1 solution. Then, 10.44 g (3.05 mmol) of phosphotungstic acid n-hydrate $H_3[PW_{12}O_{40}]\cdot nH_2O$ (manufactured by Nippon Inorganic Colour & Chemical Co., Ltd., n=30) was added to 100 ml of water, and the mixture was stirred at 90° C. to prepare a phosphotungstic acid aqueous solution. The intermediate 1 solution was mixed with the phosphotungstic acid aqueous solution at 90° C. A precipitate thus produced was obtained by filtration and washed with water. A cake thus obtained was dried, thereby obtaining 13.25 g of a blue lake color material α represented by the following chemical formula (9).

The compound thus obtained was confirmed to be a target compound from the following analysis results:

MS(ESI) (m/z): 510(+), divalent

Elemental analysis values: CHN measurement values (41.55%, 5.34%, 4.32%); theoretical values (41.66%, 5.17%, 4.11%)

Chemical Formula (9)

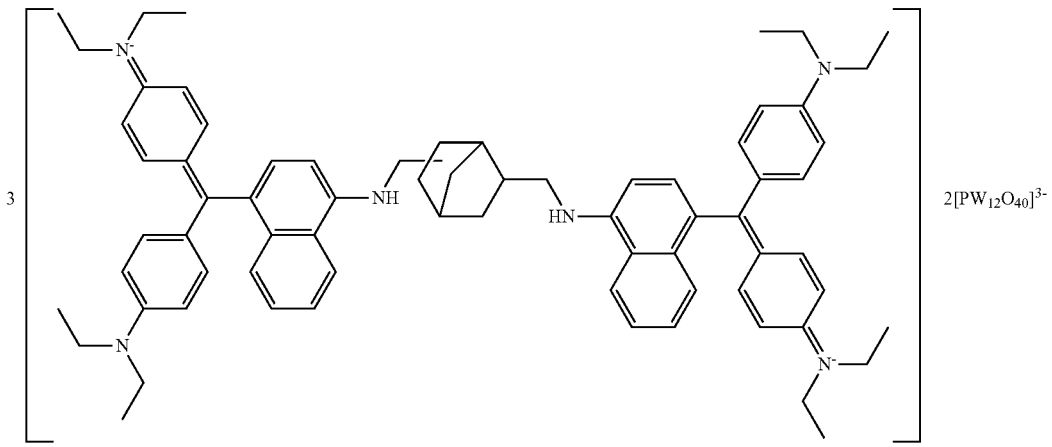

Preparation Example 2: Synthesis of Binder Resin A

First, 130 parts by mass of diethylene glycol ethyl methyl ether, which is a solvent, was put in a reactor equipped with a cooling tube, an addition funnel, a nitrogen inlet, a mechanical stirrer and a digital thermometer. After the temperature of the solvent was increased to 110° C. under a nitrogen atmosphere, a mixture of 32 parts by mass of methyl methacrylate, 22 parts by mass of cyclohexyl methacrylate, 24 parts by mass of methacrylic acid, 2 parts by mass of α,α'-azobisisobutyronitrile, which is an initiator, and 4.5 parts by mass of n-dodecyl mercaptan, which is a chain transfer agent, was continuously added to the solvent in a dropwise manner for 1.5 hours.

Then, with maintaining the synthesis temperature, the reaction was continued. Two hours after the completion of the addition of the mixture in a dropwise manner, 0.05 part by mass of p-methoxyphenol, which is a polymerization inhibitor, was added thereto.

Next, with injecting air into the mixture, 22 parts by mass of glycidyl methacrylate was added to the mixture. After the temperature of the mixture was increased to 110° C., 0.2 part by mass of triethylamine was added thereto, and an addition reaction was caused at 110° C. for 15 hours in the mixture, thereby obtaining a binder resin A (solid content 44% by mass).

The binder resin A thus obtained had a mass average molecular weight (Mw) of 8500 and an acid value of 85 mgKOH/g. The mass average molecular weight Mw was calculated by gel permeation chromatography (GPC) using polystyrene as a standard material and THF as an eluent. The acid value was obtained in accordance with JIS-K0070.

Preparation Example 3: Preparation of Salt-Type Block Polymer Dispersant A Solution In a 100 mL recovery flask, 34.30 parts by mass of PGMEA and 14.25 parts by mass (effective solid content 8.55 parts by mass) of a block copolymer containing tertiary amino groups (the block copolymer containing at least a constitutional unit represented by the general formula (III)) (product name: BYK-LPN 6919; manufactured by: BYK-Chemie GmbH) (amine value 120 mgKOH/g, solid content 60% by mass) were dissolved. Then, 1.45 parts by mass (0.5 molar equivalent with respect to the tertiary amino groups of the block copolymer) of phenylphosphonic acid ("PPA" manufactured by Nissan Chemical Industries, Ltd.) was added to the mixture. The mixture was stirred at 40° C. for 30 minutes, thereby preparing a salt-type block polymer dispersant A solution (solid content 20% by mass). The amino groups of the block copolymer included those each forming a salt by an acid-base reaction with the acidic group of PPA.

Preparation Example 4: Preparation of Binder Composition A

A binder composition A (solid content 40% by mass) was prepared by mixing the following: 19.82 parts by mass of PGMEA, 18.18 parts by mass of the binder resin A of Preparation Example 2 (solid content 44% by mass), 8.00 parts by mass of a pentafunctional and hexafunctional acrylate monomer (product name: ARONIX M403, manufactured by: TOAGOSEI Co., Ltd.), 3.00 parts by mass of 2-methyl-1-[4-(methylthio)phenyl]-2-morpholinopropane-1-one (product name: Irgacure 907, manufactured by: BASF) and 1.00 parts by mass of 2,4-diethylthioxanthone (product name: KAYACURE DETX-S, manufactured by: Nippon Kayaku Co., Ltd.)

Example 1

(1) Preparation of Rhodamine-Based Color Material Dispersion Liquid A

First, 5.00 parts by mass of the rhodamine-based color material A obtained in Synthesis Example 1, which is a color material, 45.00 parts by mass (effective solid content 9.00 parts by mass) of the salt-type block polymer dispersant A solution prepared in Preparation Example 3, and 50.00 parts by mass of PGMEA were mixed. Using a paint shaker (manufactured by Asada Iron Works Co., Ltd.), the mixture was subjected to a pre-dispersion for 1 hour with 2 mm zirconia beads and then a main dispersion for 6 hours with 0.1 mm zirconia beads, thereby obtaining a rhodamine-based color material dispersion liquid A.

(2) Preparation of Color Resin Composition

First, 70.98 parts by mass of the rhodamine-based color material dispersion liquid A obtained in the above (1), 18.16 parts by mass of the binder composition A obtained in Preparation Example 4, 10.86 parts by mass of PGMEA, 0.04 part by mass of surfactant R08MH (product name, manufactured by DIC) and 0.4 part by mass of silane coupling agent KBM503 (product name, manufactured by Shin-Etsu Silicones) were mixed. The mixture thus obtained was subjected to pressure filtration, thereby obtaining a color resin composition of Example 1.

Examples 2 to 7 and Comparative Examples 1 to 5

(1) Preparation of Rhodamine-Based Color Material Dispersion Liquids B to L

Rhodamine-based color material dispersion liquids B to L were prepared in the same manner as Example 1, except that the color material was changed as shown in the following Table 2.

(2) Preparation of Color Resin Compositions

Color resin compositions of Examples 2 to 7 and Comparative Examples 1 to 5 were prepared in the same manner as Example 1, except that the rhodamine-based color material dispersion liquid A was changed as shown in the following Table 2.

(Evaluation)

<Dispersion Performance Evaluation>

To evaluate the dispersion performance of the color material dispersion liquids used in Examples and Comparative Examples, the average particle diameter of the color material particles in the color material dispersion liquids were measured. To measure the average particle diameter, "Nanotrac Particle Size Analyzer UPA-EX150" (product name, manufactured by MicrotracBEL Corp.) was used. The average particle diameter used herein means both the average dispersed particle diameter and the volume average particle diameter. The results are shown in Table 2.

TABLE 2

| | Dispersion liquid | Color material | Ratio of integral values of peaks ($I_4/I_6$) | Peak width (ppm) | | Particle diameter (nm) | Optical performance evaluation after post baking at 230° C. | | | |
|---|---|---|---|---|---|---|---|---|---|---|
| | | | | | | | x | y | Y | Contrast |
| Example 1 | Rhodamine-based color material dispersion liquid A | Rhodamine-based color material A | 0.17 | A | 8.5 | 105 | 0.388 | 0.166 | 20.7 | 3107 |
| Example 2 | Rhodamine-based color material dispersion liquid B | Rhodamine-based color material B | 0.18 | A | 8.2 | 107 | 0.388 | 0.166 | 20.6 | 3116 |
| Example 3 | Rhodamine-based color material dispersion liquid C | Rhodamine-based color material C | 0.20 | A | 8.1 | 105 | 0.387 | 0.165 | 20.6 | 3025 |
| Example 4 | Rhodamine-based color material dispersion liquid D | Rhodamine-based color material D | 0.24 | A | 7.8 | 107 | 0.388 | 0.165 | 20.4 | 3061 |
| Example 5 | Rhodamine-based color material dispersion liquid E | Rhodamine-based color material E | 0.40 | A | 8.3 | 115 | 0.387 | 0.164 | 20.2 | 2896 |
| Example 6 | Rhodamine-based color material dispersion liquid F | Rhodamine-based color material F | 0.45 | A | 7.7 | 120 | 0.387 | 0.164 | 20.1 | 2874 |
| Comparative Example 1 | Rhodamine-based color material dispersion liquid G | Rhodamine-based color material G | 0.63 | B | 11 | 130 | 0.388 | 0.164 | 19.6 | 2515 |
| Comparative Example 2 | Rhodamine-based color material dispersion liquid H | Rhodamine-based color material H | 0.89 | B | 9.3 | 146 | 0.388 | 0.162 | 18.6 | 1885 |
| Example 7 | Rhodamine-based color material dispersion liquid I | Rhodamine-based color material I | 0.45 | A | 7.9 | 120 | 0.387 | 0.164 | 19.9 | 2804 |

TABLE 2-continued

| | Dispersion liquid | Color material | Ratio of integral values of peaks ($I_4/I_6$) | Peak width | Particle diameter (nm) | Optical performance evaluation after post baking at 230° C. | | | |
|---|---|---|---|---|---|---|---|---|---|
| | | | | (ppm) | | x | y | Y | Contrast |
| Comparative Example 3 | Rhodamine-based color material dispersion liquid J | Rhodamine-based color material J | 1.29 | B | 6.9 | 204 | 0.387 | 0.156 | 16.0 | 688 |
| Comparative Example 4 | Rhodamine-based color material dispersion liquid K | Rhodamine-based color material K | 0.08 | A | 14.2 | 153 | 0.387 | 0.161 | 18.7 | 1815 |
| Comparative Example 5 | Rhodamine-based color material dispersion liquid L | Rhodamine-based color material L | — | — | — | 510 | 0.387 | 0.149 | 11.7 | 232 |

<Optical Performance Evaluation and Heat Resistance Evaluation>

Each of the color resin compositions obtained in Examples and Comparative Examples was applied onto a glass substrate with a thickness of 0.7 mm (product name: OA-10G, manufactured by: Nippon Electric Glass Co., Ltd.) using a spin coater, heat-dried on a hot plate at 80° C. for 3 minutes, and then irradiated with ultraviolet light at 40 mJ/cm$^2$ using an ultrahigh-pressure mercury lamp, thereby obtaining a cured film (red color layer). The substrate on which the cured film was formed, was subjected to post baking in a clean oven at 230° C. for 30 minutes. The chromaticity (x, y) and luminance (Y) of the obtained cured film were measured using microscopic spectrophotometer OSP-SP200 (product name, manufactured by Olympus Corporation). The contrast of the same was measured using contrast measuring device CT-1B (product name, manufactured by Tsubosaka Electric Co., Ltd.) The chromaticity (x) of the cured film after the post baking was controlled to be in a range of from 0.387 to 0.388.

The results are shown in Table 2.

A criterion for evaluation of the results obtained in Examples 1 to 7 and Comparative Examples 1 to 5, is shown below.

[NMR Evaluation Criterion: the Ratio ($I_4/I_6$) between the Integral Values]

A: The ratio ($I_4/I_6$) between the integral values was 0.50 or less.

B: The ratio ($I_4/I_6$) between the integral values was more than 0.50.

When evaluated as "A", it means that the lake color material is evaluated as containing a molecular structure derived from a polyaluminum chloride in which the keggin structure is not contained or, even if the keggin structure is contained, the content is small, and thus as being suitable for practical use.

[Evaluation Results]

From FIG. 7, it is clear that in the case of diluting the polyaluminum chloride, as time proceeds, the integral value ($I_4$) of the peak corresponding to the four-coordinate aluminum in the solid-state $^{27}$Al-NMR spectrum increases. It is also clear that this change is remarkably promoted by heating. FIG. 8 shows that for the color material synthesized by the use of the polyaluminum chloride with low basicity, the peak corresponding to the six-coordinate aluminum contains a shoulder, which suggests that the structure of the polyaluminum chloride is non-uniform. FIG. 9 shows that in the case of synthesizing the color material using the aluminum nitrate, only a peak corresponding to an aluminum monomer (Al(H$_2$O)$_6$) is found, and it is clear that an aluminum multimer such as a polyaluminum chloride is not present.

For the lake color materials of Synthesis Examples 1 to 12, each of which is such a lake color material that it was obtained by laking the acid dye with the polyaluminum chloride with a basicity of 70% or more and the value of the ratio ($I_4/I_6$) was from 0 to 0.50, the peak width at a spectral intensity of 0 of the peak corresponding to the six-coordinate aluminum, is 13 ppm or less. For the lake color material of Comparative Synthesis Example 4, which is a lake color material obtained by laking the acid dye with the polyaluminum chloride with a low basicity of 53.9%, the peak width at a spectral intensity of 0 of the peak corresponding to the six-coordinate aluminum, was 14.2 ppm.

From the results shown in Table 2, the following is clear: excellent dispersibility can be obtained, and a high-contrast, high-luminance color layer can be formed by the color resin compositions of Examples 1 to 7, each of which used such a lake color material that it was obtained by laking the rhodamine-based acid dye (AR289) with the polyaluminum chloride with a basicity of 70% or more and the value of the ratio ($I_4/I_6$) between the integral value ($I_4$) of the peak corresponding to the four-coordinate aluminum in the solid-state $^{27}$Al-NMR spectrum and the integral value ($I_6$) of the peak corresponding to the six-coordinate aluminum therein, is from 0 to 0.50. Of them, the color resin compositions of Examples 1 to 4 that used such a lake color material that the value of the peak ($I_4/I_6$) is less than 0.40, can obtain excellent dispersibility and can form a high-contrast, high-luminance color layer.

Meanwhile, poor dispersibility and a color layer with poor contrast and poor luminance were obtained in Comparative Examples 1 to 3 that used such a lake color material that the value of the ratio ($I_4/I_6$) is more than 0.50 although the polyaluminum chloride with a basicity of 70% or more was used as the laking agent.

Meanwhile, poor dispersibility and a color layer with poor contrast and poor luminance were obtained in Comparative Example 4 in which the rhodamine-based acid dye (AR289) was laked with the polyaluminum chloride with a basicity of less than 70% and the peak width at a spectral intensity of 0 of the peak corresponding to the six-coordinate aluminum in the solid-state $^{27}$Al-NMR spectrum, is more than 13 ppm.

Meanwhile, poor dispersibility and a color layer with poor contrast and poor luminance were obtained in Comparative Example 5 in which the aluminum nitrate was used as the laking agent.

Examples 8 to 12 and Comparative Examples 6 to 10

(1) Preparation of Color Material Dispersion Liquids

Color material dispersion liquids of Examples 8 to 12 and Comparative Examples 6 to 10 were prepared in the same manner as Example 1, except that the color material was changed as shown in the following Table 3.

(2) Preparation of Color Resin Compositions

Color resin compositions of Examples 8 to 12 and Comparative Examples 6 to 10 were prepared in the same manner as Example 1, except that the rhodamine-based color material dispersion liquid A was changed as shown in the following Table 3.

(Evaluation)

<Optical Performance Evaluation and Heat Resistance Evaluation>

Each of the color resin compositions obtained in Examples 8 to 12 and Comparative Examples 6 to 10 was applied onto a glass substrate with a thickness of 0.7 mm (product name: OA-10G, manufactured by: Nippon Electric Glass Co., Ltd.) using a spin coater, heat-dried on a hot plate at 80° C. for 3 minutes, and then irradiated with ultraviolet light at 40 mJ/cm$^2$ using an ultrahigh-pressure mercury lamp, thereby obtaining a cured film (color layer). The substrate on which the cured film was formed, was subjected to post baking in a clean oven at the temperature shown in the following table for 30 minutes. After the post baking, the chromaticity (x, y) and luminance (Y) of the obtained cured film were measured using microscopic spectrophotometer OSP-SP200 (product name, manufactured by Olympus Corporation). The contrast of the same was measured using contrast measuring device CT-1B (product name, manufactured by Tsubosaka Electric Co., Ltd.)

The results are shown in Table 3.

TABLE 3

| | Dispersion liquid | Color material | Ratio of integral values of peaks ($I_4/I_6$) | | Peak width (ppm) | Particle diameter (nm) | Baking temperature (° C.) | Optical performance evaluation after post baking | | | |
|---|---|---|---|---|---|---|---|---|---|---|---|
| | | | | | | | | x | y | Y | Contrast |
| Example 8 | Anthraquinone-based color material dispersion liquid A | Anthraquinone-based color material A | <0.1 | A | 8.2 | 120 | 200 | 0.176 | 0.178 | 26.7 | 7807 |
| Comparative Example 6 | Anthraquinone-based color material dispersion liquid B | Anthraquinone-based color material B | 0.55 | B | 8.6 | 140 | 200 | 0.176 | 0.178 | 26.7 | 7271 |
| Example 9 | Phthalocyanine-based color material dispersion liquid A | Phthalocyanine-based color material A | <0.1 | A | 9.7 | 321 | 200 | 0.189 | 0.287 | 47.3 | 5183 |
| Comparative Example 7 | Phthalocyanine-based color material dispersion liquid B | Phthalocyanine-based color material B | 0.51 | B | 8.8 | 532 | 200 | 0.189 | 0.293 | 46.6 | 3563 |
| Example 10 | Triarylmethane-based color material dispersion liquid A | Triarylmethane-based color material A | <0.1 | A | 7.7 | 147 | 150 | 0.138 | 0.083 | 8.6 | 5503 |
| Comparative Example 8 | Triarylmethane-based color material dispersion liquid B | Triarylmethane-based color material B | 0.69 | B | 9 | 330 | 150 | 0.138 | 0.085 | 8.9 | 2937 |
| Example 11 | Disazo-based color material dispersion liquid A | Disazo-based color material A | <0.1 | A | 7.9 | 98 | 200 | 0.434 | 0.507 | 90.4 | 8498 |
| Comparative Example 9 | Disazo-based color material dispersion liquid B | Disazo-based color material B | 0.66 | B | 9 | 191 | 200 | 0.431 | 0.504 | 89.9 | 6464 |
| Example 12 | Monoazo-based color material dispersion liquid A | Monoazo-based color material A | <0.1 | A | 10.5 | 131 | 200 | 0.477 | 0.361 | 47.7 | 6185 |
| Comparative Example 10 | Monoazo-based color material dispersion liquid B | Monoazo-based color material B | 0.52 | B | 11.1 | 273 | 200 | 0.483 | 0.357 | 38.6 | 1383 |

From the results shown in Table 3, the following is clear: excellent dispersibility can be obtained, and a high-contrast color layer can be formed in Examples 8 to 12 that used such a lake color material that even in the case of using the anthraquinone-based color material, phthalocyanine-based color material, triarylmethane-based color material, disazo-based color material or monoazo-based color material as the acid dye, the acid dye was laked with the polyaluminum chloride with a basicity of 70% or more and the value of the ratio ($I_4/I_6$) between the integral value ($I_4$) of the peak corresponding to the four-coordinate aluminum in the solid-state $^{27}$Al-NMR spectrum and the integral value ($I_6$) of the peak corresponding to the six-coordinate aluminum therein, is from 0 to 0.50.

Meanwhile, it is clear that poor dispersibility and a color layer with poor contrast were obtained in Comparative Examples 6 to 10 that used such a lake color material that the value of the ratio ($I_4/I_6$) is more than 0.50 although the polyaluminum chloride with a basicity of 70% or more was used as the laking agent.

Example 13

(1) Preparation of Blue Color Material Dispersion Liquid A

First, 11.70 parts by mass of the blue lake color material α of Preparation Example 1, 1.30 parts by mass of the rhodamine-based color material A of Synthesis Example 1, 22.75 parts by mass (effective solid content: 4.55 parts by mass) of the salt-type block polymer dispersant A solution prepared in Preparation Example 3, 13.30 parts by mass (effective solid content: 5.85 parts by mass) of the binder resin A of Preparation Example 2, and 50.95 parts by mass of PGMEA were mixed. Using the paint shaker (manufactured by Asada Iron Works Co., Ltd.), the mixture was subjected to a pre-dispersion for 1 hour with 2 mm zirconia beads and then a main dispersion for 6 hours with 0.1 mm zirconia beads, thereby obtaining a blue color material dispersion liquid A.

(2) Preparation of Color Resin Composition

First, 27.30 parts by mass of the blue color material dispersion liquid A of Example 13 obtained in the above (1), 27.03 parts by mass of the binder composition A obtained in Preparation Example 4, 45.67 parts by mass of PGMEA, 0.04 part by mass of surfactant R08MH (product name, manufactured by DIC) and 0.4 part by mass of silane coupling agent KBM503 (product name, manufactured by Shin-Etsu Silicones) were mixed. The mixture thus obtained was subjected to pressure filtration, thereby obtaining a blue color resin composition of Example 13.

Comparative Examples 11 to 15

(1) Preparation of Blue Color Material Dispersion Liquids B to F

Blue color material dispersion liquids B to F were prepared in the same manner as Example 13, except that the color materials and the mass ratio of the color materials were changed as shown in the following Table 4.

(2) Preparation of Color Resin Compositions

Color resin compositions of Comparative Examples 11 to 15 were prepared in the same manner as Example 13, except that the blue color material dispersion liquid A was changed as shown in the following Table 4.

(Evaluation)

<Optical Performance Evaluation and Heat Resistance Evaluation>

The color resin compositions obtained in Example 13 and Comparative Examples 11 to 15 were evaluated in the same manner as Example 1. The target chromaticity (y) after the post baking was controlled to be 0.050 (y=0.050).

The results are shown in Table 4.

<Sublimability Evaluation>

Each of the blue color resin compositions obtained in Example 13 and Comparative Examples 11 to 15, was applied onto a glass substrate with a thickness of 0.7 mm (product name: OA-10G, manufactured by: Nippon Electric Glass Co., Ltd.) using the spin coater and heat-dried on the hot plate at 80° C. for 3 minutes. A color layer thus obtained was irradiated with ultraviolet light at 40 mJ/cm$^2$ using the ultrahigh-pressure mercury lamp, through a photomask with an 80 μm line-and-space stripe pattern. Then, the glass substrate on which the color layer was formed, was subjected to shower development for 60 seconds, using a 0.05% by mass potassium hydroxide aqueous solution as an alkaline developer. Then, the glass substrate was washed with ultrapure water for 60 seconds.

A glass substrate was placed 0.7 mm above the glass substrate on which a color pattern thus obtained was formed, and the glass substrate on which the color pattern was formed was heated on the hot plate at 230° C. for 30 minutes. To evaluate sublimability, the upper glass substrate was visually observed to see if a sublimate appeared thereon. The results are shown in Table 4.

TABLE 4

| | Color material dispersion liquid | Color materials | | Mass ratio of color materials | | Dispersed particle diameter (nm) | Optical performance after post baking | | | | Sublimability |
| | | Blue color material | Toning color material | Blue color material | Toning color material | | x | y | Y | Contrast | |
| --- | --- | --- | --- | --- | --- | --- | --- | --- | --- | --- | --- |
| Example 13 | Blue color material dispersion liquid A | Blue color material α | Rhodamine-based color material A | 70 | 30 | 110 | 0.158 | 0.050 | 5.15 | 3220 | No sublimate produced |
| Comparative Example 11 | Blue color material dispersion liquid B | Blue color material α | Rhodamine-based color material H | 70 | 30 | 125 | 0.158 | 0.050 | 5.10 | 2538 | No sublimate produced |
| Comparative Example 12 | Blue color material dispersion liquid C | Blue color material α | Rhodamine-based color material L | 70 | 30 | 203 | 0.155 | 0.050 | 4.78 | 938 | No sublimate produced |

TABLE 4-continued

| | Color material dispersion liquid | Color materials | | Mass ratio of color materials | | Dispersed particle diameter (nm) | Optical performance after post baking | | | | Sublimability |
|---|---|---|---|---|---|---|---|---|---|---|---|
| | | Blue color material | Toning color material | Blue color material | Toning color material | | x | y | Y | Contrast | |
| Comparative Example 13 | Blue color material dispersion liquid D | Blue color material α | Rhodamine-based color material M | 65 | 35 | 168 | 0.158 | 0.050 | 5.08 | 1572 | Red sublimate produced |
| Comparative Example 14 | Blue color material dispersion liquid E | Blue color material α | Rhodamine-based color material N | 65 | 35 | 169 | 0.157 | 0.050 | 5.10 | 3016 | White sublimate produced |
| Comparative Example 15 | Blue color material dispersion liquid F | Blue color material α | Dioxazine pigment | 60 | 40 | 111 | 0.157 | 0.050 | 4.33 | 2447 | No sublimate produced |

Dioxazine Pigment: Pigment Violet 23

From the results of Example 13 shown in Table 4, it is clear that a high-luminance, high-contrast coating film (blue color layer) with excellent heat resistance, is obtained by using such a lake color material that it was obtained by laking the rhodamine-based acid dye with the polyaluminum chloride with a basicity of 70% or more and the value of the ratio ($I_4/I_6$) is from 0 from 0.50, in combination with the blue lake color material α represented by the general formula (I). It is also clear that the specific polyaluminum chloride lake color material of the rhodamine-based acid dye is a color material inhibited from subliming when heated at high temperature.

Meanwhile, it is clear that a coating film (blue color layer) with poor contrast is obtained in the case of using such a lake color material that it was obtained by, as shown in Comparative Example 11, laking the rhodamine-based acid dye with the polyaluminum chloride with a basicity of 70% or more and the value of the ratio ($I_4/I_6$) is more than 0.50.

From Comparative Example 12, it is clear that a coating film (blue color layer) with poor luminance and remarkably poor contrast is obtained in the case of using the color material (rhodamine-based color material L) obtained by laking the rhodamine-based basic dye with the aluminum nitrate, in combination with the blue lake color material α represented by the general formula (I).

Meanwhile, as shown in Comparative Example 13, in the case of using the color material (rhodamine-based color material M) obtained by laking the rhodamine-based basic dye with phosphotungstic acid, in combination with the blue lake color material α represented by the general formula (I), a coating film with poor luminance is obtained, and a red sublimate is generated from the color material. Therefore, this case does not reach a practical level.

As shown in Comparative Example 14, in the case of using the quaternary ammonium salt of the rhodamine-based acid dye (rhodamine-based color material N) in combination with the blue lake color material α represented by the general formula (I), a coating film with poor contrast is obtained, and a white sublimate is generated from the color material.

From Comparative Example 15, it is clear that in the case of using the dioxazine pigment (Pigment Violet 23) in combination with the blue lake color material α represented by the general formula (I), a coating film with remarkably poor luminance and poor contrast is obtained.

REFERENCE SIGNS LIST

1. Transparent substrate
2. Light shielding part
3. Color layer
10. Color filter
13a, 13b. Orientation film
15. Liquid crystal layer
20. Counter substrate
25a, 25b. Polarization plate
30. Backlight
40. Liquid crystal display device
50. Organic protection layer
60. Inorganic oxide layer
71. Transparent positive electrode
72. Positive hole injection layer
73. Positive hole transport layer
74. Light-emitting layer
75. Electron injection layer
76. Negative electrode
80. Light-emitting body

The invention claimed is:

1. A color material dispersion liquid comprising: (A) a color material, (B) a dispersant and (C) a solvent, wherein the color material (A) contains a lake color material of a combination of an acid dye and a polyaluminum chloride; a basicity of the polyaluminum chloride is 70% or more; and a value of a ratio ($I_4/I_6$) between an integral value ($I_4$) of a peak corresponding to a four-coordinate aluminum in a solid-state $^{27}$Al-NMR spectrum of the lake color material and an integral value ($I_6$) of a peak corresponding to a six-coordinate aluminum therein, is from 0 to 0.50.

2. The color material dispersion liquid according to claim 1, wherein the acid dye in the lake color material is a rhodamine-based acid dye.

3. The color material dispersion liquid according to claim 1, wherein the color material (A) further contains a color material represented by the following general formula (I):

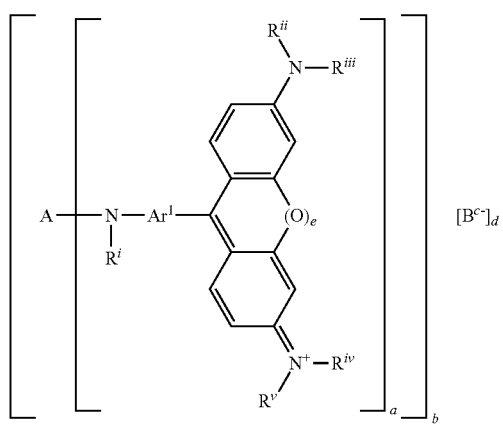

(I)

wherein "A" is an "a"-valent organic group in which a carbon atom directly bound to "N" contains no π bond, and the organic group is an aliphatic hydrocarbon group containing a saturated aliphatic hydrocarbon group at least at a terminal position directly bound to "N", or an aromatic group containing the aliphatic hydrocarbon group, and O, S, N can be contained in a carbon chain of the organic group; $B^{c-}$ is a "c"-valent polyoxometalate anion; each of $R^i$ to $R^v$ is independently a hydrogen atom, an alkyl group which can contain a substituent group, or an aryl group which can contain a substituent group; $R^{ii}$ and $R^{iii}$ can be bound to form a ring structure, and/or $R^{iv}$ and $R^v$ can be bound to form a ring structure; $Ar^1$ is a divalent aromatic group which can contain a substituent group; a plurality of $R^i$s can be the same or different; a plurality of $R^{ii}$s can be the same or different; a plurality of $R^{iii}$s can be the same or different; a plurality of $R^{iv}$s can be the same or different; a plurality of $R^v$s can be the same or different; a plurality of $Ar^1$s can be the same or different;

"a" and "c" are each an integer of 2 or more, and "b" and "d" are each an integer of 1 or more; "e" is 0 or 1, and there is no bond when "e" is 0; and a plurality of "e"s can be the same or different.

4. The color material dispersion liquid according to claim 2, wherein the color material (A) further contains a color material represented by the following general formula (I):

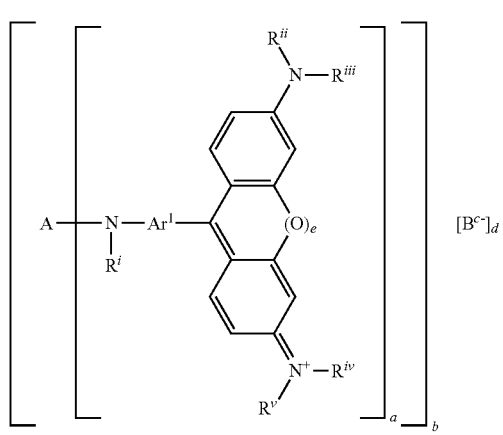

(I)

wherein "A" is an "a"-valent organic group in which a carbon atom directly bound to "N" contains no π bond, and the organic group is an aliphatic hydrocarbon group containing a saturated aliphatic hydrocarbon group at least at a terminal position directly bound to "N", or an aromatic group containing the aliphatic hydrocarbon group, and O, S, N can be contained in a carbon chain of the organic group; $B^{c-}$ is a "c"-valent polyoxometalate anion; each of $R^i$ to $R^V$ is independently a hydrogen atom, an alkyl group which can contain a substituent group, or an aryl group which can contain a substituent group; $R^{ii}$ and $R^{iii}$ can be bound to form a ring structure, and/or $R^{iv}$ and $R^v$ can be bound to form a ring structure; $Ar^1$ is a divalent aromatic group which can contain a substituent group; a plurality of $R^i$s can be the same or different; a plurality of $R^{ii}$s can be the same or different; a plurality of $R^{iii}$s can be the same or different; a plurality of $R^{iv}$s can be the same or different; a plurality of $R^v$s can be the same or different; a plurality of $Ar^1$s can be the same or different;

"a" and "c" are each an integer of 2 or more, and "b" and "d" are each an integer of 1 or more; "e" is 0 or 1, and there is no bond when "e" is 0; and a plurality of "e"s can be the same or different.

5. A color resin composition comprising the color material dispersion liquid defined by claim 1 and (D) a binder component.

6. A color resin composition comprising the color material dispersion liquid defined by claim 2 and (D) a binder component.

7. A color resin composition comprising the color material dispersion liquid defined by claim 3 and (D) a binder component.

8. A color resin composition comprising the color material dispersion liquid defined by claim 4 and (D) a binder component.

9. A color material wherein the color material is a lake color material of a combination of an acid dye and a polyaluminum chloride; a basicity of the polyaluminum chloride is 70% or more; and a value of a ratio $(I_4/I_6)$ between an integral value $(I_4)$ of a peak corresponding to a four-coordinate aluminum in a solid-state $^{27}$Al-NMR spectrum of the lake color material and an integral value $(I_6)$ of a peak corresponding to a six-coordinate aluminum therein, is from 0 to 0.50.

10. The color material according to claim 9, wherein the acid dye in the lake color material is a rhodamine-based acid dye.

11. A color filter comprising at least a transparent substrate and color layers disposed on the substrate, wherein at least one of the color layers contains a lake color material of a combination of an acid dye and a polyaluminum chloride; a basicity of the polyaluminum chloride is 70% or more; and a value of a ratio $(I_4/I_6)$ between an integral value $(I_4)$ of a peak corresponding to a four-coordinate aluminum in a solid-state $^{27}$Al-NMR spectrum of the lake color material and an integral value $(I_6)$ Of a peak corresponding to a six-coordinate aluminum therein, is from 0 to 0.50.

12. A method for producing a color filter comprising at least a transparent substrate and color layers disposed on the substrate, the method comprising a step of forming at least one of the color layers on the transparent substrate by curing the color resin composition for a color filter defined by claim 5.

13. A method for producing a color filter comprising at least a transparent substrate and color layers disposed on the substrate, the method comprising a step of forming at least one of the color layers on the transparent substrate by curing the color resin composition for a color filter defined by claim 6.

14. A method for producing a color filter comprising at least a transparent substrate and color layers disposed on the substrate, the method comprising a step of forming at least one of the color layers on the transparent substrate by curing the color resin composition for a color filter defined by claim 7.

15. A method for producing a color filter comprising at least a transparent substrate and color layers disposed on the substrate, the method comprising a step of forming at least one of the color layers on the transparent substrate by curing the color resin composition for a color filter defined by claim 8.

16. A liquid crystal display device comprising the color filter defined by claim 11, a counter substrate, and a liquid crystal layer disposed between the color filter and the counter substrate.

17. A light-emitting display device comprising the color filter defined by claim 11 and a light-emitting body.

* * * * *